(12) United States Patent  (10) Patent No.: US 7,630,419 B2
Takeda  (45) Date of Patent: Dec. 8, 2009

(54) LASER LIGHT SOURCE DEVICE, AND IMAGE DEVICE USING THE SAME

(75) Inventor: Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 12/003,844

(22) Filed: Jan. 2, 2008

(65) Prior Publication Data

US 2008/0165810 A1    Jul. 10, 2008

(30) Foreign Application Priority Data

Jan. 10, 2007 (JP) ............................. 2007-002618
Nov. 30, 2007 (JP) ............................. 2007-310369

(51) Int. Cl.
*H01S 3/10* (2006.01)
*H01S 3/00* (2006.01)
(52) U.S. Cl. .................... 372/21; 372/22; 372/38.02
(58) Field of Classification Search ............... 372/21, 372/22, 25, 38.02, 38.07, 29.014
See application file for complete search history.

(56) References Cited

U.S. PATENT DOCUMENTS 7,330,490 B2 * 2/2008 Furukawa et al. ............. 372/21

FOREIGN PATENT DOCUMENTS

JP   A-2003-84325   3/2003
JP   A-2006-100772  4/2006

* cited by examiner

*Primary Examiner*—Armando Rodriguez
(74) *Attorney, Agent, or Firm*—Oliff & Berridge, PLC

(57) ABSTRACT

A laser light source device includes a light source section, and a drive current controller. The light source section includes a first and second fundamental light source component, and a wavelength conversion component. The first and second fundamental light source components emit first and second fundamental wave lights according to supplied drive currents, respectively. The drive current controller controls the drive currents supplied to the fundamental light source components. The wavelength conversion component performs wavelength conversion of the first and second fundamental wave lights to produce first and second converted lights. The first and second fundamental light source components emit the fundamental wave lights such that the first and second converted lights have substantially same color, and the first and second converted lights have no mutually overlapping timing at which light intensities of the converted lights reach their peak.

11 Claims, 17 Drawing Sheets

<Output mirror 24 reflection characteristics>

LASER LIGHT SOURCE DEVICE, AND IMAGE DEVICE USING THE SAME

CROSS-REFERENCE TO RELATED APPLICATIONS

The present application claims the priority based on Japanese Patent Applications No. 2007-2618 filed on Jan. 10, 2007, and No. 2007-310369 filed on Nov. 30, 2007, the disclosures of which are hereby incorporated by reference in its entirety.

BACKGROUND OF THE INVENTION

1. Field of the Invention

This invention relates to a laser light source device equipped with a wavelength conversion component, and a image device using the same.

2. Description of the Related Art

In recent years, high efficiency laser light source devices are used as illumination light sources for various devices such as projectors, and monitoring devices. As this kind of laser light source device, there are items that are equipped with a wavelength conversion component consisting of a non-linear optical crystal or the like, that convert infrared rays to visible light (e.g. green light, blue light or the like) with this wavelength conversion component, and emit that (see JP2006-100772A, for example).

With the kind of laser light source device equipped with a wavelength conversion component, to make brighter illumination, the power volume supplied to the laser light source (e.g. semiconductor laser array, solid state laser device or the like) is increased, and the light intensity emitted from the laser light source is increased. Because of that, to make it possible to supply more power, the scale of the power supply circuit becomes larger, and by using a component with high current drivability as the component constituting the power supply circuit, this brings increases in manufacturing costs. Also, for driving the laser light source device, there is also a demand to drive this using a preferable control mode according to the application.

SUMMARY OF THE INVENTION

An object of the present invention is to suppress the scale of the power supply circuit from becoming very large for the laser light source device equipped with a wavelength conversion component. Another object of the present invention is to provide technology for which it is possible to drive using a preferable control mode according to the application.

According to an aspect of the present invention, there is provided a laser light source device including a light source section, and a drive current controller. The light source section includes a first and second fundamental light source component, and a wavelength conversion component. The first and second fundamental light source components emit first and second fundamental wave lights according to supplied drive currents, respectively. The drive current controller controls the drive currents supplied to the fundamental light source components. The wavelength conversion component performs wavelength conversion of the first and second fundamental wave lights to produce first and second converted lights. The first and second fundamental light source components emit the fundamental wave lights such that the first and second converted lights have substantially same color, and the first and second converted lights have no mutually overlapping timing at which light intensities of the converted lights reach their peak.

With this laser light source device, the first and second fundamental light source components do not have the timing for which the light intensities of the converted lights are at their peak mutually overlap, so compared to a case when the timing at which the light intensities of the converted light reach their peak do mutually overlap for these first and second fundamental light source components, it is possible to suppress power supply from becoming very large. Note that "substantially the same color" means that the wavelengths of the lights are substantially the same. This wording has a broad meaning that lights of "substantially same color" are within a color wavelength range which can be perceived by humans as substantially the same.

According to another aspect of the present invention, there is provided a laser light source device including a light source section, and a drive current controller. The light source section includes a fundamental light source component, and a wavelength conversion component. The fundamental light source component emits fundamental wave light according to a supplied drive current. The drive current controller controls the drive current supplied to the fundamental light source component. The wavelength conversion component performs wavelength conversion of the fundamental wave light to produce converted light. The drive current controller has a plurality of control modes in which pulse widths of the drive current are mutually different.

Since this laser light source device has a plurality of control modes with different drive current pulse widths, it is possible to select a preferable control mode according to the application to control the laser light source device.

Note that the present invention may be realized with various aspects, and in addition to the above laser light source devices, it is also possible to constitute it as a monitoring device or an image display device equipped with the laser light source device. It is also not limited to these device invention aspects, but may also be realized with aspects such as a laser light source device control method, a computer program for realizing the functions of a laser light source device control method or laser light source device and monitoring device as well as image display device function, and a recording medium on which that computer program is recorded.

DESCRIPTION OF THE PREFERRED EMBODIMENT

Preferred aspects for implementing the present invention are described in the following order.

A. First Embodiment:
B. Second Embodiment:
C. Third Embodiment:
D. Fourth Embodiment:
E. Fifth Embodiment:
F. Sixth Embodiment:
G. Seventh Embodiment:
H. Eighth Embodiment:
I. Variation Examples:

A. First Embodiment

Figure 1A:
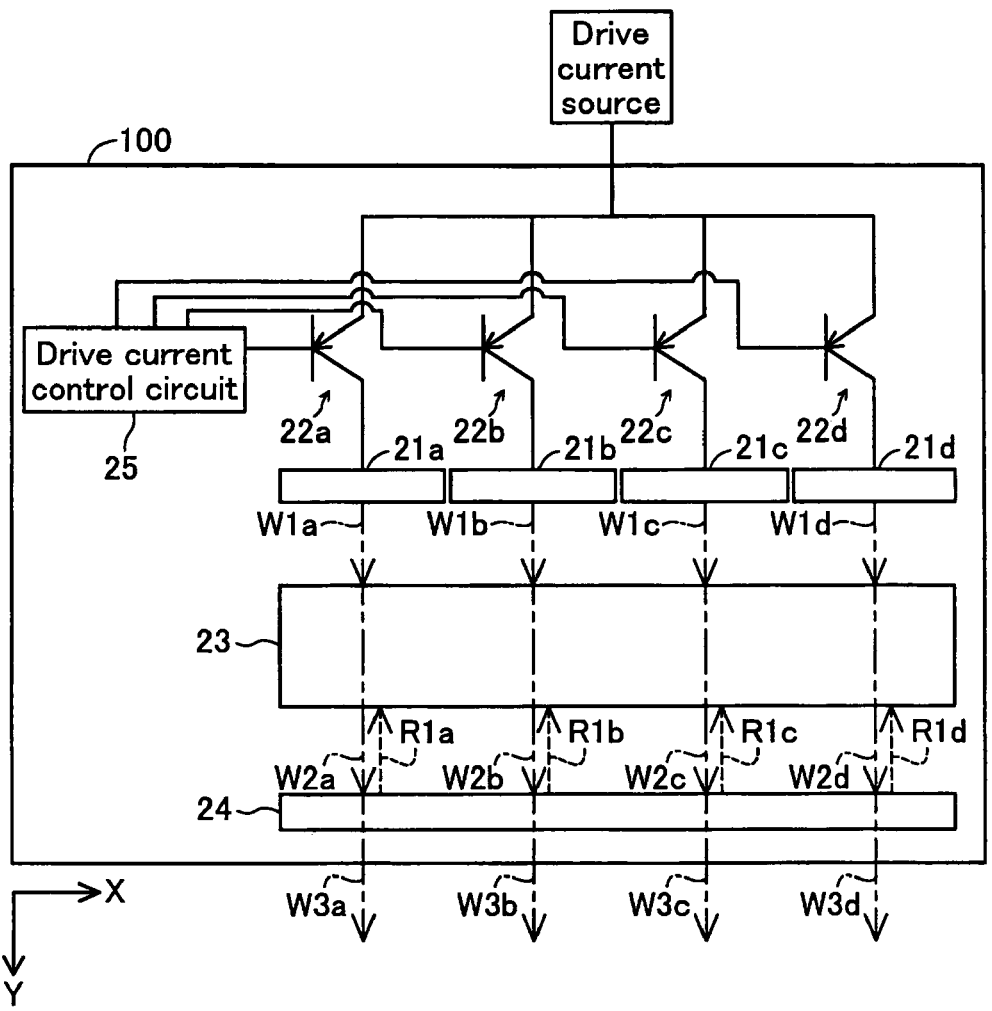
FIGS. 1A and 1B show the schematic structure of the laser light source device and the schematic structure of the semiconductor laser component 21a as an embodiment of this invention.

FIG. 1A is an explanatory drawing showing the schematic structure of a laser light source device as an embodiment of this invention. This laser light source device 100 is an external resonance type laser light source device, and is equipped with four semiconductor laser components 21a to 21d, transistors 22a to 22d for each semiconductor laser component 21a to 21d, a drive current control circuit 25 connected to the base electrode of each transistor 22a to 22d, a wavelength conversion component 23, and an output mirror 24. The four semiconductor laser components 21a to 21d are aligned in one row in the X axis direction, forming a one dimensional array structure. The part of the device which includes the semiconductor laser components 21a-21d, the wavelength conversion component 23, and the output mirror 24 may be referred to as a "light source section."

Figure 1B:
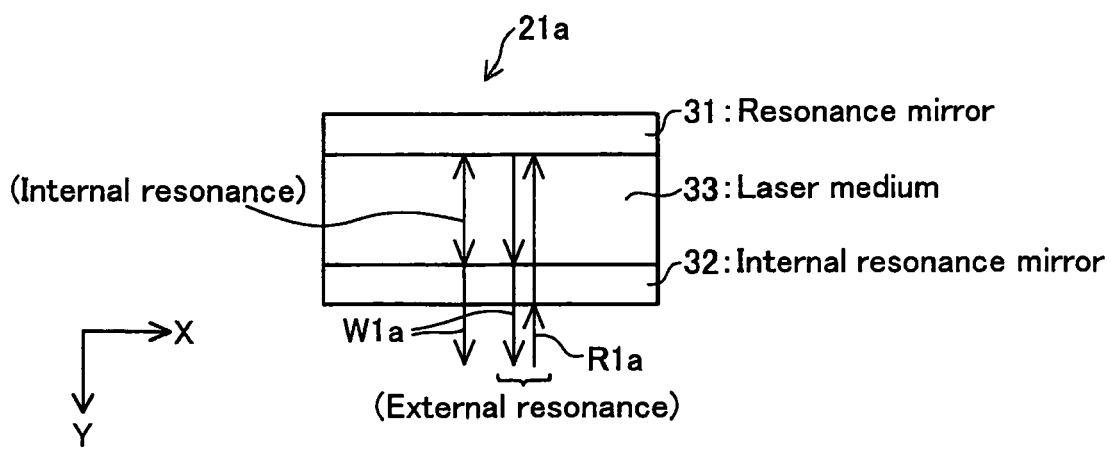

FIG. 1B is an explanatory drawing showing the schematic structure of the semiconductor laser component 21a shown in FIG. 1A. The semiconductor laser component 21a is a surface emitting type laser component, and is equipped with a resonance mirror 31, an internal resonance mirror 32, and a laser medium 33 including a clad layer and an active layer. The laser component 21a emits the laser light (hereafter called "fundamental laser light") obtained by resonance between the resonance mirror 31 and the internal resonance mirror 32 (hereafter called "internal resonance") in the Y axis direction. The internal resonance mirror 32 transmits part of the internally resonated light (fundamental laser light), and has the role of an output window. The fundamental laser light is infrared light of 1064 nm wavelength, for example. The resonance mirror 31 is a total reflection mirror, and in addition to being used for internal resonance, makes a pair with the output mirror 24 (FIG. 1A) to constitute an external resonator. The drive current is supplied via the transistor 22a (FIG. 1A), and as described previously, internal resonance is performed and fundamental laser light is emitted. The size of energy of the fundamental laser light changes proportionately to the size of the supplied drive current. Specifically, the semiconductor laser component 21a emits fundamental laser light of greater energy when a larger driver current is supplied. Note that the other semiconductor laser components 21b to 21d have the same constitution as that of the semiconductor laser component 21a.

The drive current control circuit 25 (FIG. 1A) performs control of the drive current supplied to each semiconductor laser component 21a to 21d. In specific terms, by controlling the base electrode voltage of each transistor 22a to 22d, the drive current supplied to each semiconductor laser component 21a to 21d is controlled. Therefore, with the laser light source device 100, by controlling the drive current using the drive current control circuit 25, it is possible to control the size of the energy of the fundamental laser light emitted from each semiconductor laser component 21a to 21d. Note that as the transistors 22a to 22d, it is possible to use bipolar transistors or field effect transistors (FET).

The wavelength conversion component 23 (FIG. 1A) is a component that causes the second harmonic generation (SHG) phenomenon, which is a two dimensional non-linear optical phenomenon for which two photons are converted to one photon having twice the oscillation count (converted to light of ½ the wavelength), and has a polarization inversion structure formed on a ferroelectric material. For example, as the wavelength conversion component 23, it is possible to use PPLN (periodically poled $LiNb_3$).

Figure 2:
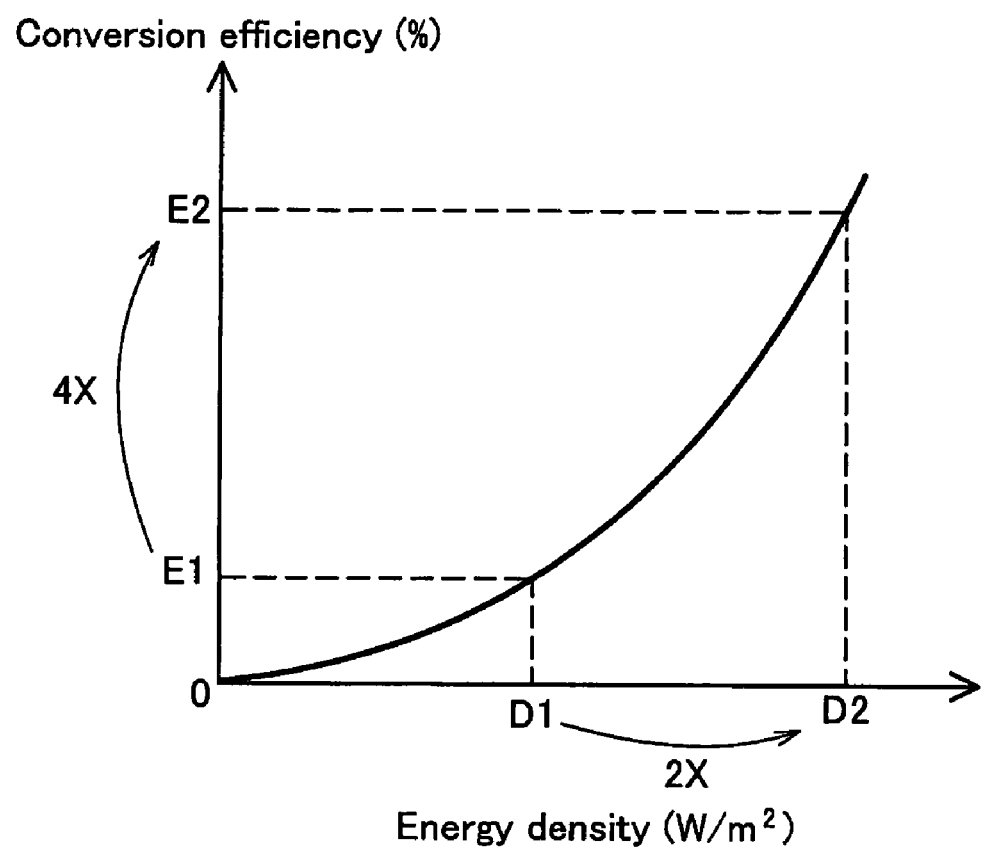
FIG. 2 is an explanatory drawing typically showing the wavelength conversion efficiency characteristics of the wavelength conversion component 23 shown in FIG. 1A.

FIG. 2 is an explanatory drawing typically showing the wavelength conversion efficiency characteristics of the wavelength conversion component 23 shown in FIG. 1A. With the wavelength conversion component 23, the wavelength conversion efficiency changes according to the density of the energy of the input light. In specific terms, with the wavelength conversion component 23, the higher the input light energy density, the greater amount of light for which the wavelength conversion is performed, and the more wavelength converted light that is emitted. With the example of FIG. 2, when the energy density rises from D1 ($W/m^2$) to D2 ($W/m^2$), the conversion efficiency rises from E1 (%) to E2 (%). Here, with the conversion characteristics of the wavelength conversion component 23, the energy density and the conversion efficiency are not linearly proportional, and as the energy density increases, the conversion efficiency increases exponentially. With the example in FIG. 2, when the energy density increases by twice from D1 ($W/m^2$) to D2 ($W/m^2$), the conversion efficiency increases by four times from E1 (%) to E2 (%). Therefore, with the wavelength conversion component 23, when the energy density increases by twice, the light intensity of the wavelength conversion light increases by four times.

Figure 3:
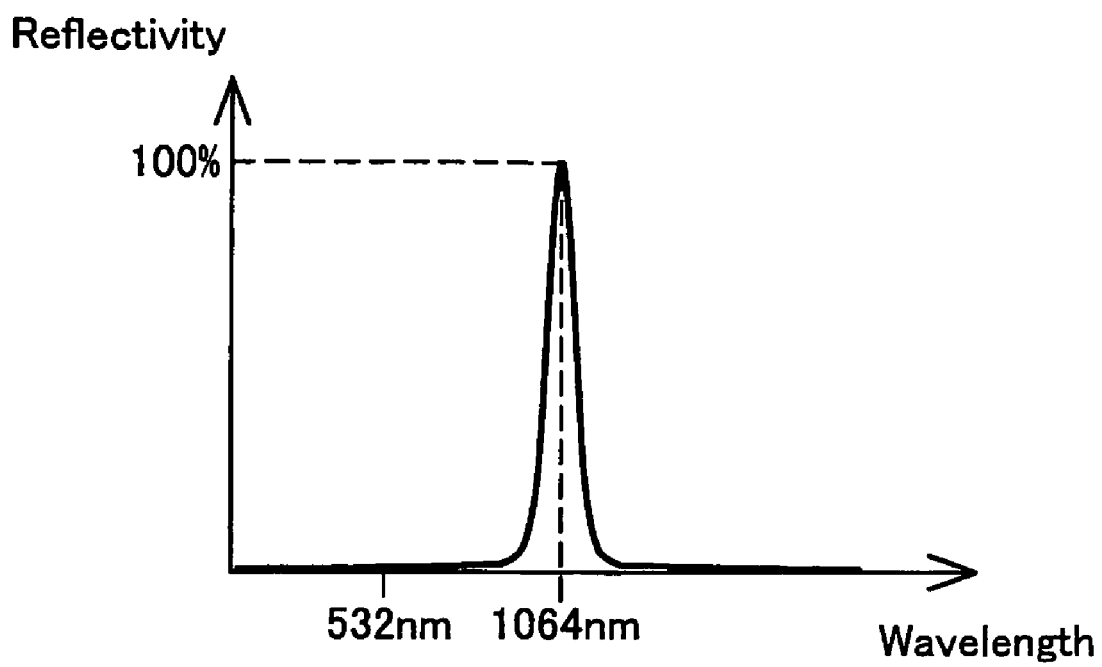
FIG. 3 is an explanatory drawing typically showing the reflection characteristics of the output mirror shown in FIG. 1A.

FIG. 3 is an explanatory drawing typically showing the reflection characteristics of the output mirror 24 shown in FIG. 1A. The output mirror 24 is constituted with a dielectric thin film layer (TiO$_2$ layer, SiO$_2$ layer or the like) formed on the glass substrate. The output mirror 24 exhibits a high reflectivity locally for a designated width wavelength range with 1064 nm as the central wavelength, and exhibits a low reflectivity in other wavelength ranges.

As described above, the laser light source device 100 (FIG. 1A) is constructed as an external resonance type laser light source. Here, "external resonance type" indicates a device in which the light emitted from the semiconductor laser component is resonated by the resonator provided outside the semiconductor laser component and amplified. Specifically, with the laser light source device 100, the fundamental laser light emitted from the semiconductor laser components 21a to 21d are further resonated and amplified using the external resonator constituted by the output mirror 24 and the resonance mirror 31 (FIG. 1B), and this is emitted as higher power laser light.

In specific terms, the fundamental laser light W1a of 1064 nm wavelength emitted from the semiconductor laser component 21a (FIG. 1A) is input to the wavelength conversion component 23. Then, at the wavelength conversion component 23, part of the fundamental laser light W1a is converted to 532 nm wavelength light, which is green light. Note that this wavelength conversion is performed at a conversion efficiency less than 100% according to the energy density of the fundamental laser light W1a. Therefore, included in the light W2a emitted from the wavelength conversion component 23 are the 532 nm wavelength light after wavelength conversion and 1064 wavelength light which did not undergo wavelength conversion. Then, the 532 nm wavelength light contained in the light W2a is almost all transmitted through the output mirror 24 (see FIG. 3), and is emitted as light W3a to outside the laser light source device 100. Meanwhile, the 1064 nm wavelength light contained in the light W2a is reflected, at the output mirror 24 (see FIG. 3), and that reflected light R1a is transmitted through the wavelength conversion component 23 and returns to the semiconductor laser component 21a, is reflected by the internal resonance mirror 32 (FIG. 1B) and is again emitted toward the wavelength conversion component 23. The above operation is executed in the same way as well for the semiconductor laser components 21b to 21d. Note that the semiconductor laser components 21a to 21d are not limited to a constitution that emits exactly the same colored light as the light after wavelength conversion, and it is also possible to have a constitution that emits light of substantially the same color. "Light of substantially the same color" means that the wavelength is substantially the same; it may have a broad meaning including that it belongs to a wavelength range which can be perceived by humans as substantially the same color. For example, it is possible to also have a constitution for which if the light after the wavelength conversion is green light, the light W3a to W3d is light of any wavelength within a range of 495 nm to 585 nm.

Figure 4A:
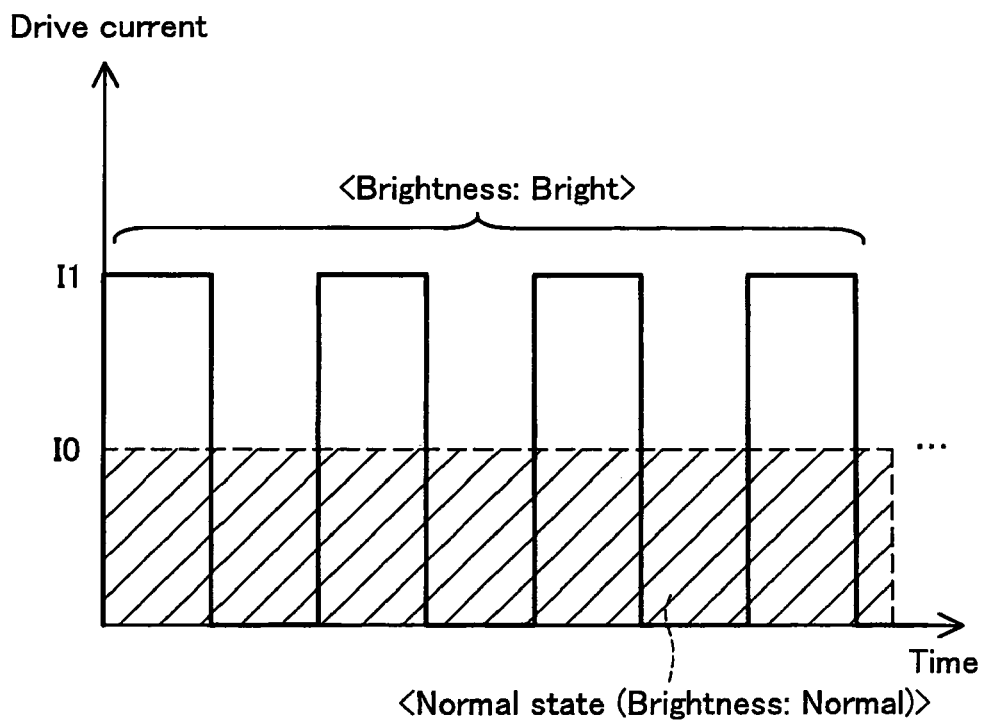
FIGS. 4A and 4B show the changes over time of the drive current when the light intensity emitted from the laser light source device is increased and shining is brighter than the normal state, and shows the changes over time of the drive current when the light intensity is increased further and made to shine even brighter.

FIG. 4A is an explanatory drawing showing changes over time of the drive current when the light intensity emitted from the laser light source device 100 is in a normal state and in an increased state. In FIG. 4A, the horizontal axis shows time, and the vertical axis shows the drive current. In the normal state, the drive current control circuit 25 (FIG. 1A) controls to always have the transistors 22a to 22d on, so as to supply a fixed drive current to the semiconductor laser components 21a to 21d. With the example in FIG. 4A, the normal state is set so that the constant drive current I0 is supplied to the semiconductor laser components 21a to 21d. When there is an instruction to increase the light intensity emitted to the laser light source device 100, the drive current control circuit 25 controls the transistors 22a to 22d so as to supply a pulse form drive current to the semiconductor laser components 21a to 21d. With the example shown in FIG. 4A, the pulse type drive current with the duty ratio of 0.5 and the peak current value I1 is supplied to the semiconductor laser components 21a to 21d. Note that the current value I1 is twice the current value I0. Drive current of the same current value may be supplied to the semiconductor laser components 21a to 21d at mutually the same timing.

In this case, the drive current value increases from I0 to I1, so the energy of the fundamental laser light W1a to W1d made incident to the wavelength conversion component 23 increases. At the wavelength conversion component 23, the irradiation area of the fundamental laser light W1a to W1d almost doesn't change at all, so the energy density of the fundamental laser light W1a to W1d increases. Therefore, as shown in FIG. 2, the wavelength conversion efficiency with the wavelength conversion component 23 increases exponentially, and the light intensity of the 532 nm wavelength light after the wavelength conversion increases. Consequently, the light intensity of the light W3a to W3d emitted from the laser light source device 100 increases, making it possible to shine more brightly.

The supply power volume for increasing the light intensity emitted from the laser light source device 100 is as follows. With the example in FIG. 4A, in the brighter state, compared to the normal state, the duty ratio is 1/2, and the current is twice. Therefore, if the voltage is fixed, the supplied power volume is the same as the normal state.

Figure 4B:
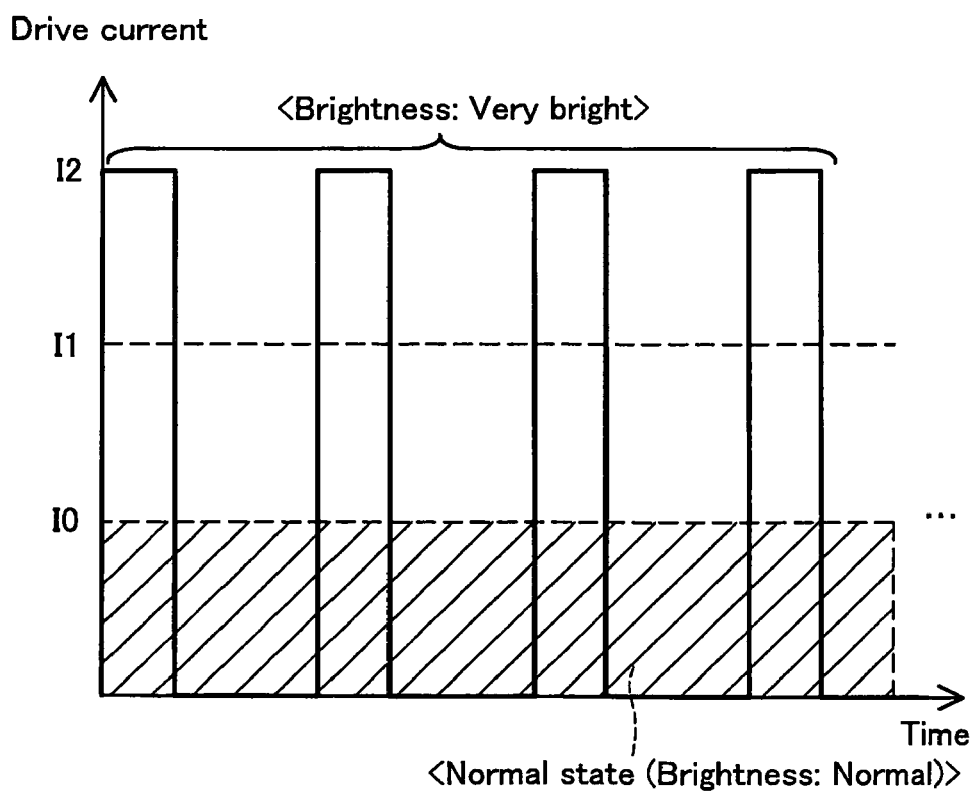

FIG. 4B is an explanatory drawing showing changes over time of the drive current when the light intensity is further increased and shines more brightly compared to the states shown in FIG. 4A. Note that the horizontal axis and the vertical axis in FIG. 4B are the same as the horizontal axis and vertical axis in FIG. 4A. When there is an instruction to shine more brightly to the laser light source device 100, the drive current control circuit 25 controls the transistors 22a to 22d so as to further increase the peak current compared to FIG. 4A, and to narrow the pulse width to make the duty ratio smaller. With the example in FIG. 4B, the peak current value I2 is about 1.5 times the current value I1, and is about 2/3 the duty ratio. In this case, the energy density of the fundamental laser light W1a to W1d at the wavelength conversion component 23 is higher than the case in FIG. 4A, and the conversion efficiency at the wavelength conversion component 23 is also higher. Because of that, the light intensity of the light W3a to W3d emitted from the output mirror 24 increases and compared to the case in FIG. 4A, it is possible to shine more brightly.

As described above, with the wavelength conversion component 23, when the energy density of the incident light becomes higher, the wavelength conversion efficiency becomes higher. Because of that, with the laser light source device 100, the current supplied to the semiconductor laser components 21a to 21d are put in pulse form, and by increasing the peak current, the energy of the fundamental laser light is increased, and thus the conversion efficiency at the wavelength conversion component 23 is increased. Accordingly, it is possible to increase the light intensity of the light that underwent wavelength conversion, and it is possible to increase the light intensity of the light W3a to W3d emitted from the laser light source device 100. At this time, control is done to make the pulse width (duty ratio) of the drive current smaller, so it is possible to suppress an increase in the supplied power volume while increasing the light intensity emitted from the laser light source device 100.

B. Second Embodiment

Figure 5:
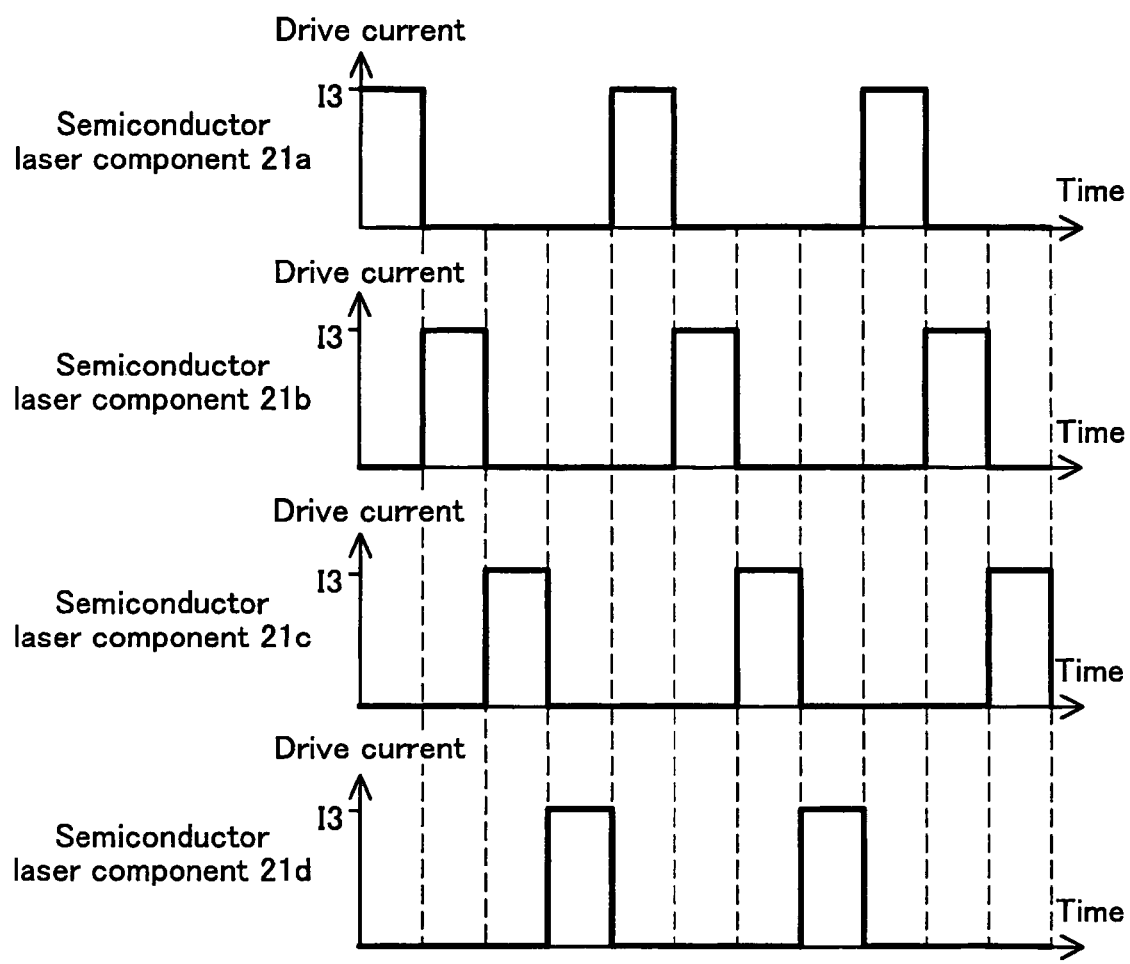
FIG. 5 is an explanatory drawing showing the changes over time of the drive current for the second embodiment.

FIG. 5 is an explanatory drawing showing changes over time of the drive current for a second embodiment. The horizontal axis and vertical axis in FIG. 5 are the same as those in FIGS. 4A and 4B. Also, with FIG. 5, the changes over time of the drive current are shown for each semiconductor laser component 21a to 21d. With this embodiment, the point of the time positions of the pulses of the drive current supplied to each semiconductor laser component 21a to 21d are mutually different. This feature is different from the first embodiment, and the remainder of the constitution is the same as the first embodiment.

As shown in FIG. 5, the same as with the first embodiment, pulse form drive current is supplied to the semiconductor laser components 21a to 21d. However, in contrast to the first embodiment, the time positions of the pulses of the drive current supplied to the semiconductor laser components 21a to 21d are mutually different, and each pulse does not have time overlap with the other pulses. Note that the duty ratio of the drive currents supplied to the semiconductor laser components 21a to 21d are all 0.25, and the peak current value for all is I3.

By using this kind of constitution, even when the constitution has the semiconductor laser components 21a to 21d connected in parallel, the peak current value supplied to the laser light source device 100 is kept to I3. Note that if, as with the first embodiment, the time position of the pulses of the drive current of each semiconductor laser component 21a matches, because the semiconductor laser components 21a to 21d are connected in parallel, the peak current value supplied to the laser light source device 100 is four times the current I3. Therefore, by using the kind of constitution noted above, as the components that constitute the circuit for supplying the drive current, it is possible to constitute the laser light source device 100 without using components with very high current drivability, and it is possible to suppress a rise in the manufacturing cost of the laser light source device 100.

Figure 6:
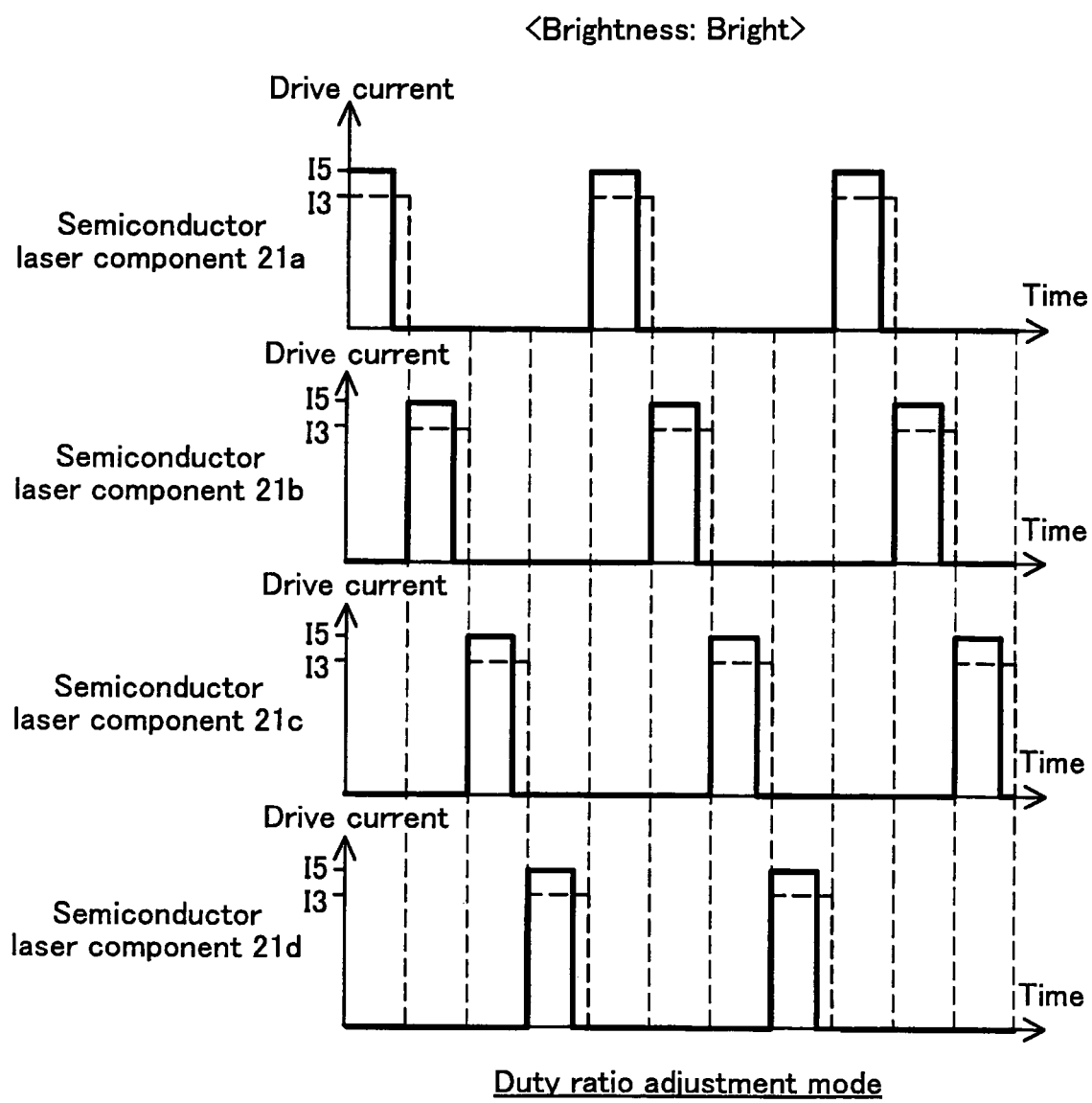
FIG. 6 is an explanatory drawing showing the changes over time of the drive current when the light intensity is even further increased from the state of FIG. 5 and made to shine even more brightly.

FIG. 6 is an explanatory drawing showing changes over time in the drive current when the light intensity is further increased and the shining is brighter than the state in FIG. 5. Note that the horizontal axis and vertical axis of FIG. 6 are the same as those of FIG. 5. Also, the changes over time of the drive current shown in FIG. 5 are shown with a dotted line for comparison. With the example in FIG. 6, compared to the case in FIG. 5, the pulse peak current value has increased from I3 to I5. Therefore, the volume of light that underwent wavelength conversion at the wavelength conversion component 23 increases, and the light intensity emitted from the laser light source device 100 also increases. Meanwhile, the duty ratio is smaller than the case in FIG. 5, so it is possible to have the power volume supplied to the laser light source device 100 be about the same level as with FIG. 5. Also, compared to the case in FIG. 5, the duty ratio is smaller, so the pulse of the drive current supplied to the semiconductor laser components 21a to 21d do not overlap in terms of time, the same as the case of FIG. 5. Therefore, the same as the example in FIG. 5, it is possible to suppress the peak value of the current supplied overall to the laser light source device 100 from becoming very high.

C. Third Embodiment

Figure 7:
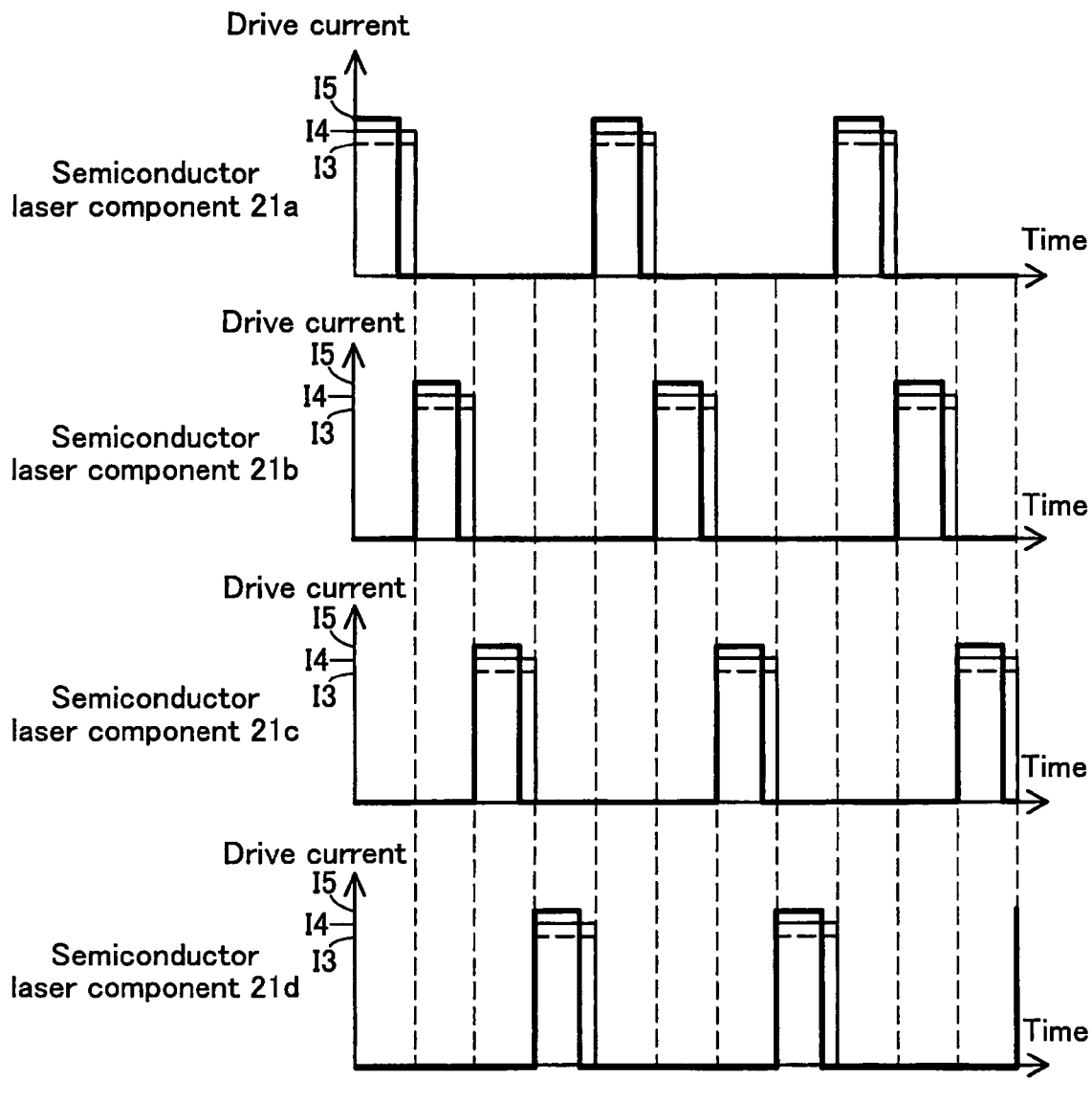
FIG. 7 is an explanatory drawing showing the changes over time of the drive current with the third embodiment.

FIG. 7 is an explanatory drawing showing changes over time of the drive current for a third embodiment. The horizontal axis and vertical axis of FIG. 7 are the same as those of FIG. 6. Also, with FIG. 7, changes over time of the drive current for each of the semiconductor laser components 21a to 21d are shown. With each of the embodiments describe above, when the laser light source device is shining more brightly, both the peak current of the drive current and the duty ratio (pulse width) are made to be changed. Note that the control mode of the drive current that changes both the drive current peak current and the duty ratio in this way is hereinafter referred to as "duty ratio adjustment mode." In contrast to this, with this embodiment, with the laser light source device, in addition to the duty ratio adjustment mode, there is also a preset control mode that changes only the peak current with the duty ratio (pulse width) left constant; this mode will be hereafter referred to as "peak current value adjustment mode." The laser light source device may be operated while the drive current is controlled in the peak current value adjustment mode or in the duty ratio adjustment mode. Note that the remainder of the constitution is the same as with the second embodiment.

The switching between these drive current control modes is performed as follows. When there is an instruction to shine more brightly to the laser light source device 100, if that instructed brightness is lower (darker) than a predetermined threshold value, the drive current is controlled in the peak current value adjustment mode, and if the instructed brightness is higher (brighter) than the threshold value, the drive current is controlled in the duty ratio adjustment mode.

With the example in FIG. 7, the same as with the second embodiment (FIG. 5), drive current of mutually different pulse time positions are supplied to the semiconductor laser components 21a to 21d, and the peak current value for the normal state, drawn with dotted lines, is I3. When there is an instruction to shine more brightly from this normal state, and if the instructed brightness is lower (darker) than a predetermined threshold value, the drive current control circuit 25 controls the drive current in the peak current value adjustment mode. In this case, with the example in FIG. 7, with the duty ratio left as is, and the peak current value rises from I3 to I4. Meanwhile, if the brightness instructed with the normal state is higher (brighter) than the predetermined threshold value, the drive current control circuit 25 controls the drive current in the duty ratio adjustment mode, the same as with the second embodiment. In this case, with the example in FIG. 7, the duty ratio becomes smaller, and the peak current value rises from I3 to I5.

The constitution described above, the same as with the second embodiment (FIG. 5), is a constitution for which drive current for which the pulse time positions are mutually different are supplied to the semiconductor laser components 21a to 21d. The present invention is not limited to this; even with a constitution for which the drive current for which the pulse time positions are the same is supplied to the semiconductor laser components 21a to 21d, as with the case with the first embodiment (FIG. 4), it is possible to construct the device so that the duty ratio adjustment mode and the peak current value adjustment modes are usable to control the drive current.

Note that the duty ratio adjustment mode described above correlates to the first control mode in the claimed invention, and the peak current value control mode correlates to the second control mode in the claimed invention. Also, the range for which the brightness is lower (darker) than a threshold value correlates to the first light intensity range in the claimed invention, and the range for which the brightness is higher (brighter) than the threshold value correlates to the second light intensity range in the claimed invention.

As described above, even with a constitution for which the drive current is controlled in either of the duty ratio adjustment mode and the peak current value adjustment mode according to the instructed brightness, compared to a constitution for which the drive current is controlled always in the peak current value adjustment mode, it is possible to reduce the volume of power supplied to the laser light source device 100.

D. Fourth Embodiment

Figure 8:
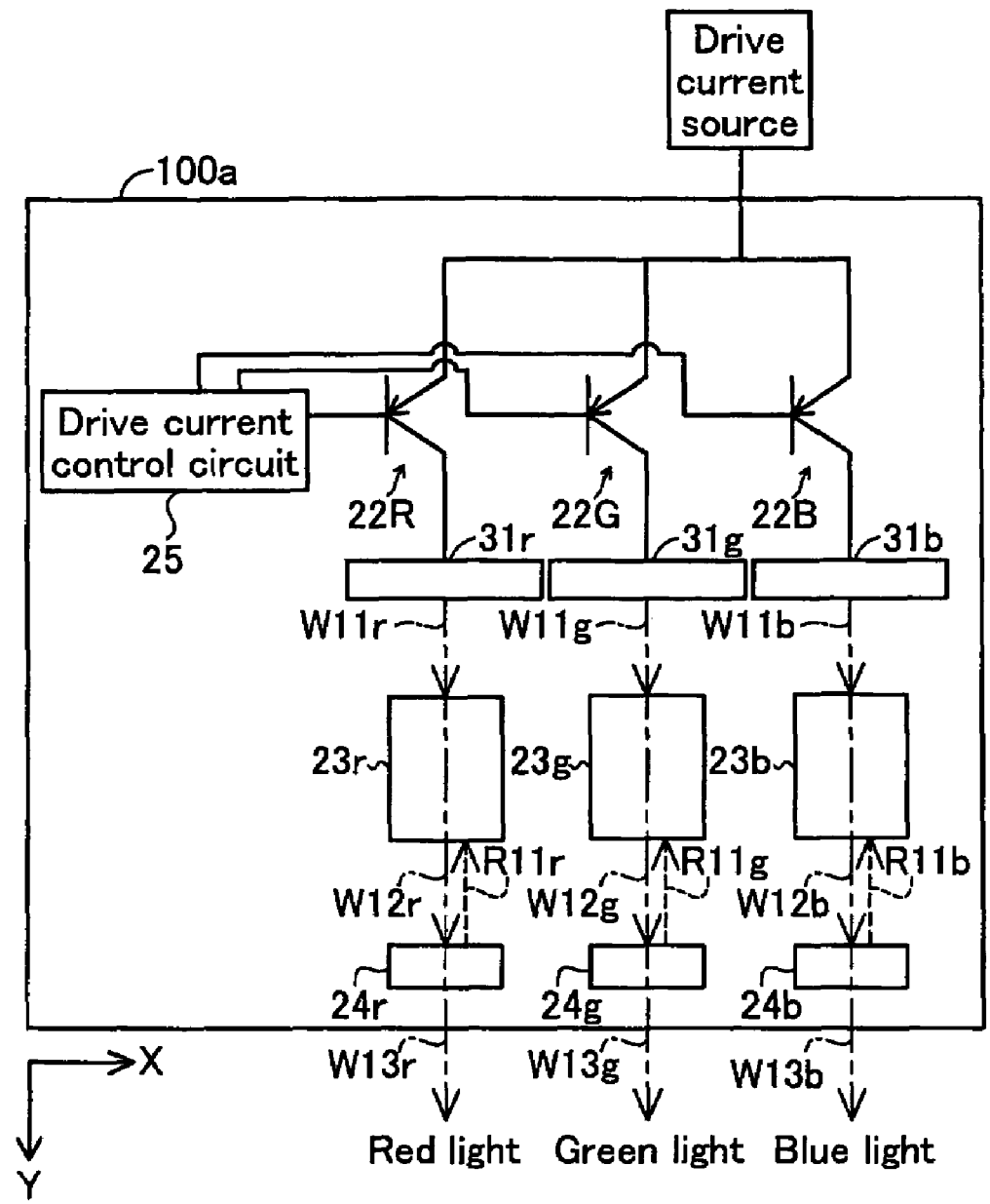
FIG. 8 is an explanatory drawing the schematic structure of the laser light source device for the fourth embodiment.

FIG. 8 is an explanatory drawing showing the schematic structure of the laser light source device of a fourth embodiment. This laser light source device 100*a* has a count of 3 for the number of semiconductor laser components, the number of transistors for supplying the drive power, the number of wavelength conversion components, and the number of output mirrors. The wavelengths of the fundamental laser light emitted from the three semiconductor laser components are mutually different. These features are different from the laser light source device 100 (FIG. 1), and the remainder of the constitution is the same as the first embodiment.

The semiconductor laser component 31*r* emits fundamental laser light W11*r* of 1270 nm wavelength. With the wavelength conversion component 23*r*, part of the fundamental laser light W11*r* is converted to light of a 635 nm wavelength (red light) and is emitted as light W12*r*. Here, the reflection characteristics of the mirror 24*r* differ from those (FIG. 3) of the output mirror 24 (FIG. 1) in terms of the fact that the central wavelength indicating a locally high reflectivity is 1270 nm. Therefore, of the light W12*r*, the red light of a 635 nm wavelength is transmitted through the mirror 24*r*, and is emitted to outside the laser light source device 100*a*. Meanwhile, the 1270 nm wavelength light contained in the light W12*r* is reflected at the mirror 24*r* and returns toward the semiconductor laser component 31*r*.

The semiconductor laser component 31*g*, the same as with the semiconductor laser components 21*a* to 21*d*, emits fundamental laser light W11*g* of 1064 nm wavelength. At the wavelength conversion component 23*g*, part of the fundamental laser light W11*g* is converted to 532 nm wavelength light (green light), and this is emitted as light W12*g*. Here, the reflection characteristics of the mirror 24*g* are the same as the reflection characteristics (FIG. 3) of the output mirror 24 (FIG. 1). Therefore, of the light W12*g*, the 532 nm wavelength green light is transmitted through the mirror 24*g*, and is emitted to outside the laser light source device 100*a*. Meanwhile, the 1064 nm wavelength light included in the light W12*g* is reflected at the mirror 24*g* and returns toward the semiconductor laser component 31*g*.

The semiconductor laser component 31*b* emits 900 nm wavelength fundamental laser light W11*b*. At the wavelength conversion component 23*b*, part of the fundamental laser light W11*b* is converted to 450 nm wavelength light (blue light), and this is emitted as light W12*b*. Here, the reflection characteristics of the mirror 24*b* differ from the reflection characteristics (FIG. 3) of the output mirror 24 (FIG. 1) in that the central wavelength indicating locally high reflectivity is 900 nm. Therefore, of the light W12*b*, the blue light of 450 nm wavelength is transmitted through the mirror 24*b*, and is emitted to outside the laser light source device 100*a*. Meanwhile, the 900 nm wavelength light included in the light W12*b* is reflected by the mirror 24*b* and returns toward the semiconductor laser component 31*b*.

In this way, the laser light source device 100*a* emits red light, green light, and blue light, and it is possible to use the laser light source device 100*a* as the image display device light source of a projector or the like that modulates light with a liquid crystal panel according to image data of R, G, and B.

The transistor 22R is connected to the semiconductor laser component 31*r*. As is the case with the first embodiment, the drive current control circuit 25 is able to control the drive current supplied to the semiconductor laser component 31*r* by controlling this transistor 22R. In the same way, the transistors 22G, 22B are connected to the semiconductor laser components 31G, 31B, and the drive current control circuit 25 is able to control the drive current supplied to the semiconductor laser components 31G, 31B by controlling the transistors 22G, 22B.

Figure 9A:
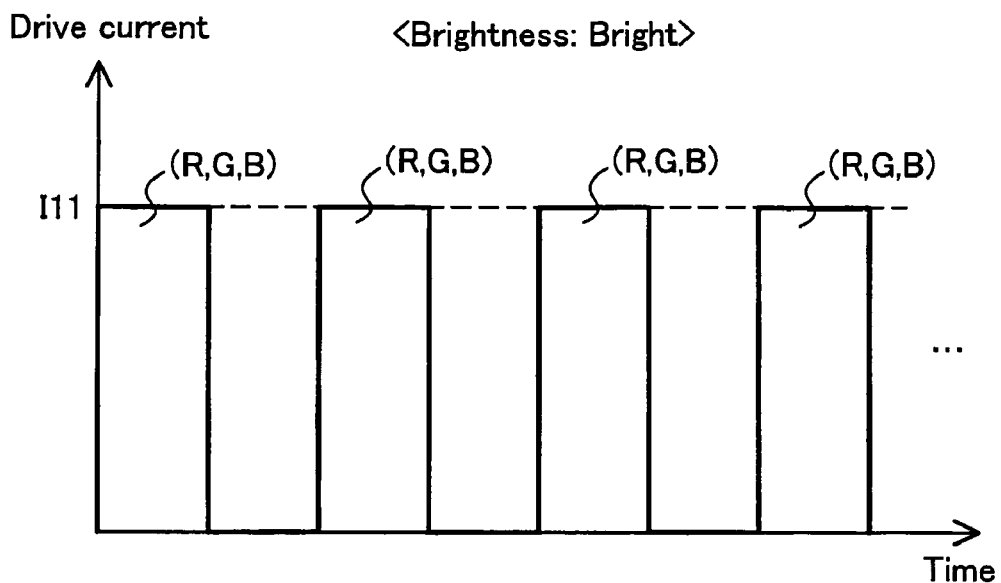
FIGS. 9A and 9B show the changes over time of the drive current when made to shine more brightly than the normal state with the fourth embodiment, an the changes over time of the drive current when made to shine even more brightly.

FIG. 9A is an explanatory drawing showing the changes over time of drive current when shining more brightly than the normal state with a third embodiment. The horizontal axis and the vertical axis in FIG. 9A are the same as those in FIGS. 4A. With the example in FIG. 9A, the drive current pulses for Red, Green, Blue lights supplied to the semiconductor laser components 31*r*, 31*g*, and 31*b* have mutually matching pulse widths (duty ratio) and peak current I11, and the pulse time positions also match.

Figure 9B:
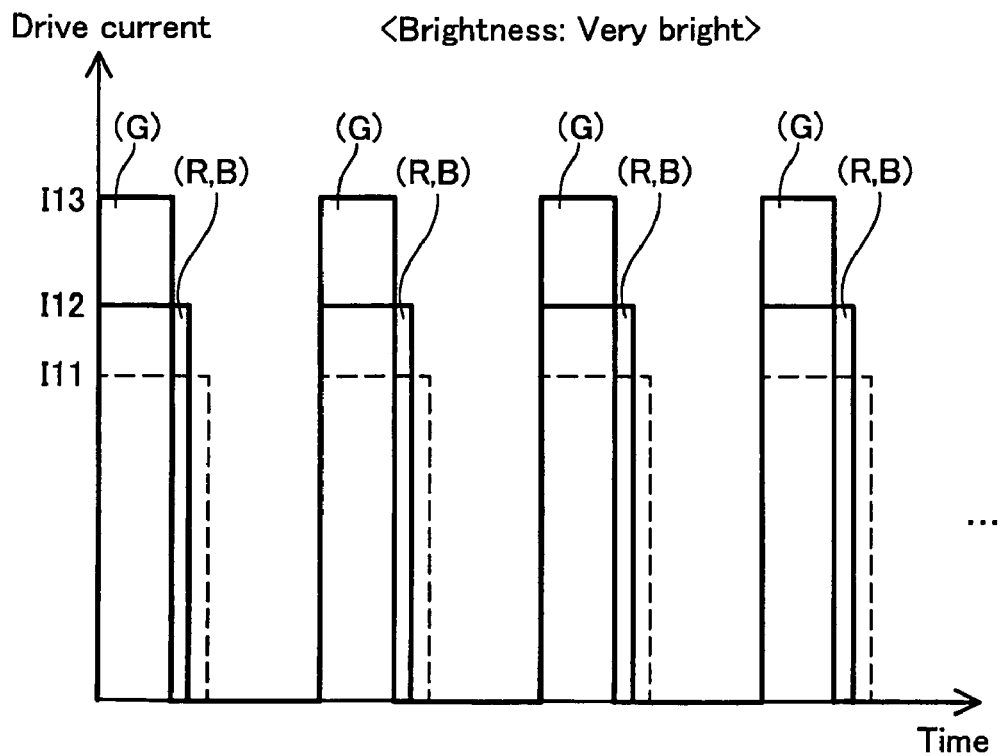

FIG. 9B is an explanatory drawing showing the changes over time of the drive current when the volume of light emitted from the laser light source device 100*a* is increased and shines more brightly than the state shown in FIG. 9A. Note that the changes over time of the drive current shown in FIG. 9A are shown with dotted lines for comparison. With the example in FIG. 9B, the drive current pulse for Red light supplied to the semiconductor laser component 31*r* and the drive current pulse for Blue light supplied to the semiconductor laser component 31*b* both have a larger peak current value I13 and a smaller duty ratio than the state in FIG. 9A. Similarly, the drive current pulse for Green light supplied to the semiconductor laser component 31*g* also has a larger peak current value I13 and a smaller duty ratio than the state shown in FIG. 9A. However, in contrast to the state in FIG. 9A, the peak current I13 of the drive current pulse supplied to the semiconductor laser component 31*g* is greater than the peak current I12 of the drive current pulse supplied to the other semiconductor laser components 31*r* and 31*b*. The reason why the drive current is controlled in this way is as follows.

The laser light source device 100*a* has a tendency that, when the light intensity is increased and shines very brightly, the intensity of the red and blue lights become stronger than that of the green light. In light of this, with the laser light source device 100*a*, the peak current value of the drive current supplied to the semiconductor laser component 31*g* is made higher than the peak current value of the drive current supplied to the other semiconductor laser components 31*r* and 31*b*, whereby the light intensity of the light W13*g* (green light) emitted from the laser light source device 100*a* is increase and the white balance is adjusted.

As described above, with the laser light source device 100*a*, the semiconductor laser components 31*r*, 31*g*, and 31*b* for emitting light of each color R, G, and B are each provided separately, and each drive current peak current value and pulse width (duty ratio) is made to be individually adjusted. Therefore, by controlling the drive current supplied to these semiconductor laser components 31*r*, 31*g*, and 31*b*, it becomes possible to adjust the white balance of the irradiated light while suppressing the increase in the volume of power supplied.

E. Fifth Embodiment

Figure 10:
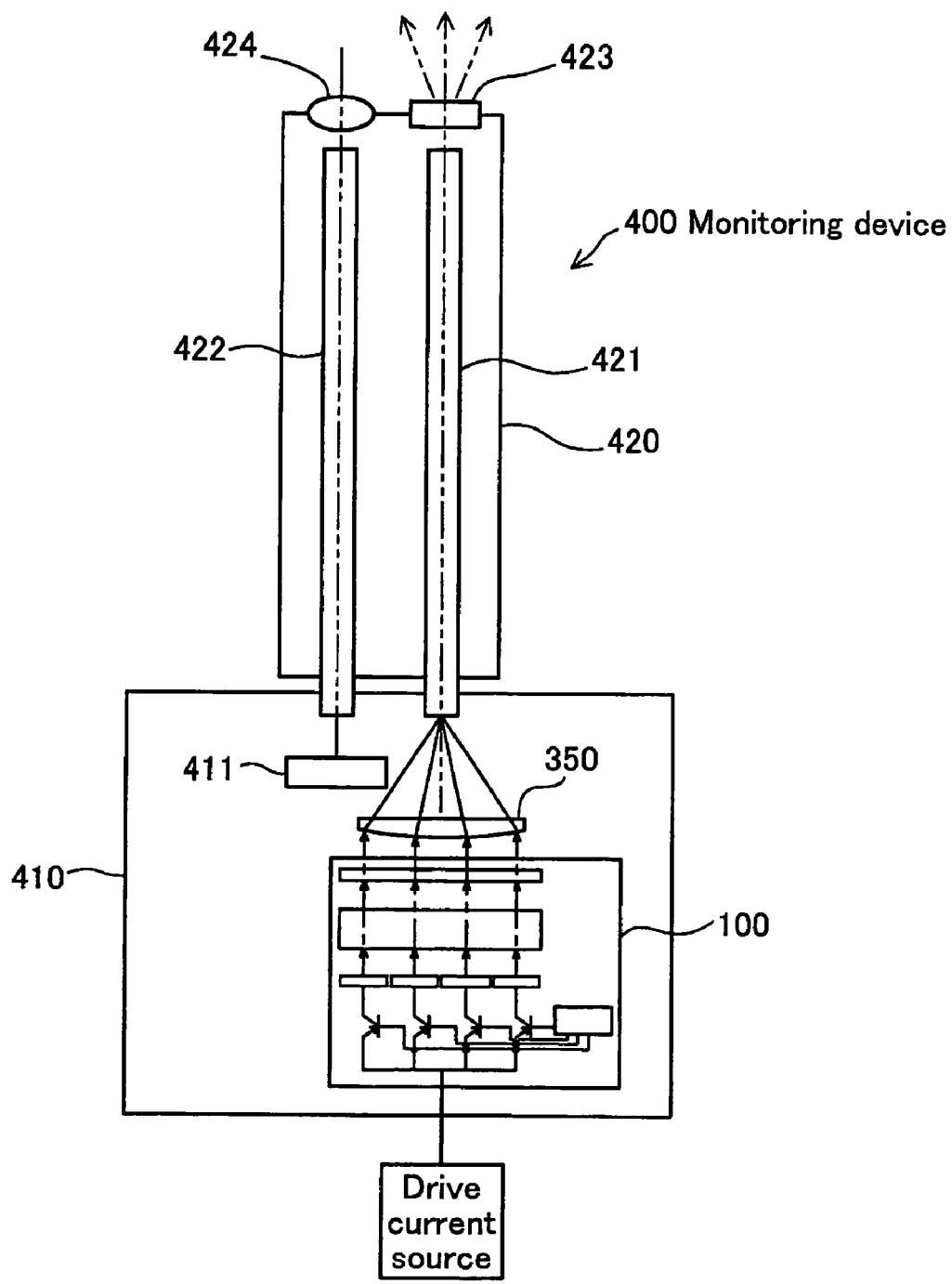
FIG. 10 is a schematic structure drawing of the monitoring device to which is applied the laser light source device of this invention.

FIG. 10 is a schematic structure drawing of a monitoring device using the laser light source device according to the present invention. This monitoring device 400 is equipped with a main device unit 410 and a light transmission unit 420. The main device unit 410 is equipped with the laser light source device 100 (FIG. 1) of the first embodiment described above. Also, the main device unit 410 is equipped with a condensing lens 350 and a camera 411.

The light transmission unit 420 is equipped with a light guide 421 on the light sending side, and a light guide 422 on the light receiving side. Each light guide 421 and 422 has many optical fibers bundled together, and is able to transmit laser light for a long distance. The laser light source device 100 is installed on the incident side of the light sending light guide 421, and a diffuser plate 423 is installed on the emitting side of the light guide 421. An imaging lens 424 is installed on the incident side of the light receiving light guide 422.

The laser light emitted from the laser light source device 100 is condensed by the condensing lens 350, and goes along the light guide 421, is diffused by the diffuser plate 423, and irradiates a photographic subject. Then, the reflected light from the photographic subject is made incident on the imaging lens 424, goes along the light guide 422, and is sent to the camera 411. By working in this way, the image based on the reflected light obtained by the photographic subject being irradiated by the laser light emitted by the laser light source device 100 will be captured by the camera 411. Note that with the monitoring device 400, instead of the laser light source device 100, it is also possible to employ the laser light source device 100a (FIG. 8) described above.

F. Sixth Embodiment

Figure 11:
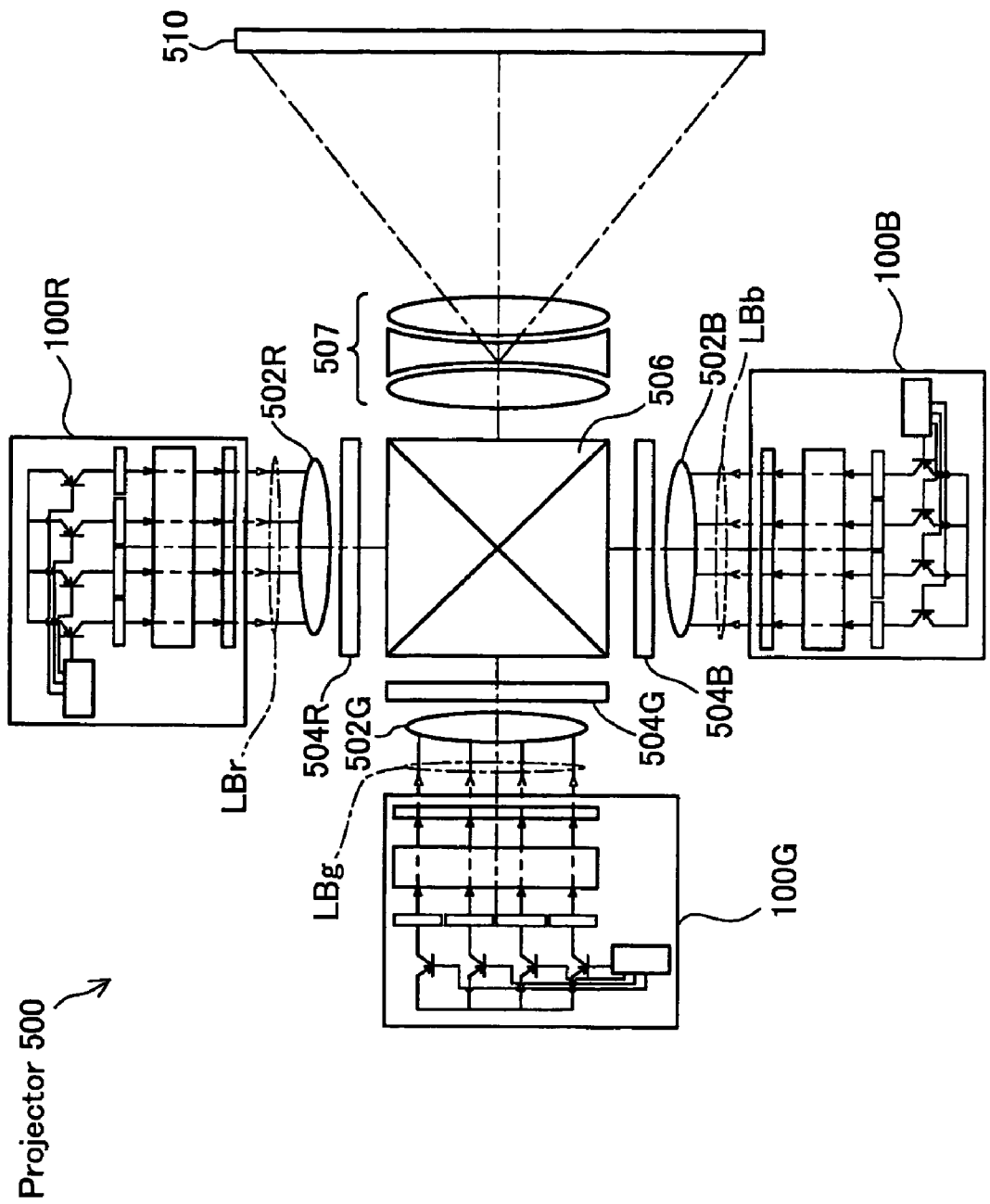
FIG. 11 is a schematic structure drawing of the projector to which is applied the laser light source device of this invention.

FIG. 11 is a schematic structure drawing of a projector using the laser light source device of this invention. This projector 500 is equipped with a laser light source device 100R that emits red light, a laser light source device 100G that emits green light, and a laser light source device 100B that emits blue light. The laser light source device 100R differs from the laser light source device 100 (FIG. 1) in that the wavelength of the fundamental laser light emitted by the laser component is 1270 nm. Furthermore, the laser light source device 100R differs from the laser light source device 100 in that wavelength conversion is done at the wavelength conversion component to red light of 635 nm wavelength, and that the central wavelength showing locally high reflectivity at the output mirror is 1270 nm. The laser light source device 100G has the same constitution as the laser light source device 100 (FIG. 1). The laser light source device 100B differs from the laser light source device 100 (FIG. 1) in that the wavelength of the fundamental laser light emitted by the laser component is 900 nm. Furthermore, the laser light source device 100B differs from the laser light source device 100 in that wavelength conversion is done at the wavelength conversion component to blue light of 450 nm wavelength, and that the central wavelength showing locally high reflectivity at the output mirror is 900 nm.

Also, the projector 500 is equipped with liquid crystal light valves 504R, 504G, and 504B that respectively modulate each color laser light LBr, LBg, and LBb emitted from each laser light source device 100R, 100G, and 100B according to the image signals sent from a personal computer (not illustrated) or the like. Also, the projector 500 is equipped with a cross dichroic prism 506 that synthesizes the light emitted from the liquid crystal light valves 504R, 504G, and 504B, and a projection lens 507.

Furthermore, the projector 500 has installed equalizing optical systems 502R, 502G, and 502B on the side further downstream of the light path than the laser light source devices 100R, 100G, and 100B to equalize the illuminance distribution of the laser light emitted from the laser light source devices 100R, 100G, and 100B. The projector 500 irradiates the liquid crystal light valves 504R, 504G, and 504B with the light for which the illuminance distribution has been equalized by these equalizing optical systems 502R, 502G, and 502B. Note that the equalizing optical systems 502R, 502G, and 502B may be constituted by combining a hologram and a field lens, for example.

The three color lights modulated by the liquid crystal light valves 504R, 504G, and 504B are made incident on the cross dichroic prism 506. This cross dichroic prism 506 is formed with four right angle prisms adhered together, and on the inner surface, a dielectric multi layer film that reflects red light and a dielectric multi layer film that reflects blue light are arranged in a cross shape. Then, the synthesized light is projected onto a screen 510 by the projection lens 507, and an enlarged image is displayed.

With the projector 500 having the constitution described above, at each laser light source device 100R, 100G, and 100B, it is possible to make the brightness of the irradiated light brighter while suppressing an increase in the supplied power volume. Therefore, even for the overall projector 500, it is possible to make the brightness of the displayed image brighter while suppressing an increase in the supplied power volume.

G. Seventh Embodiment

Figure 12:
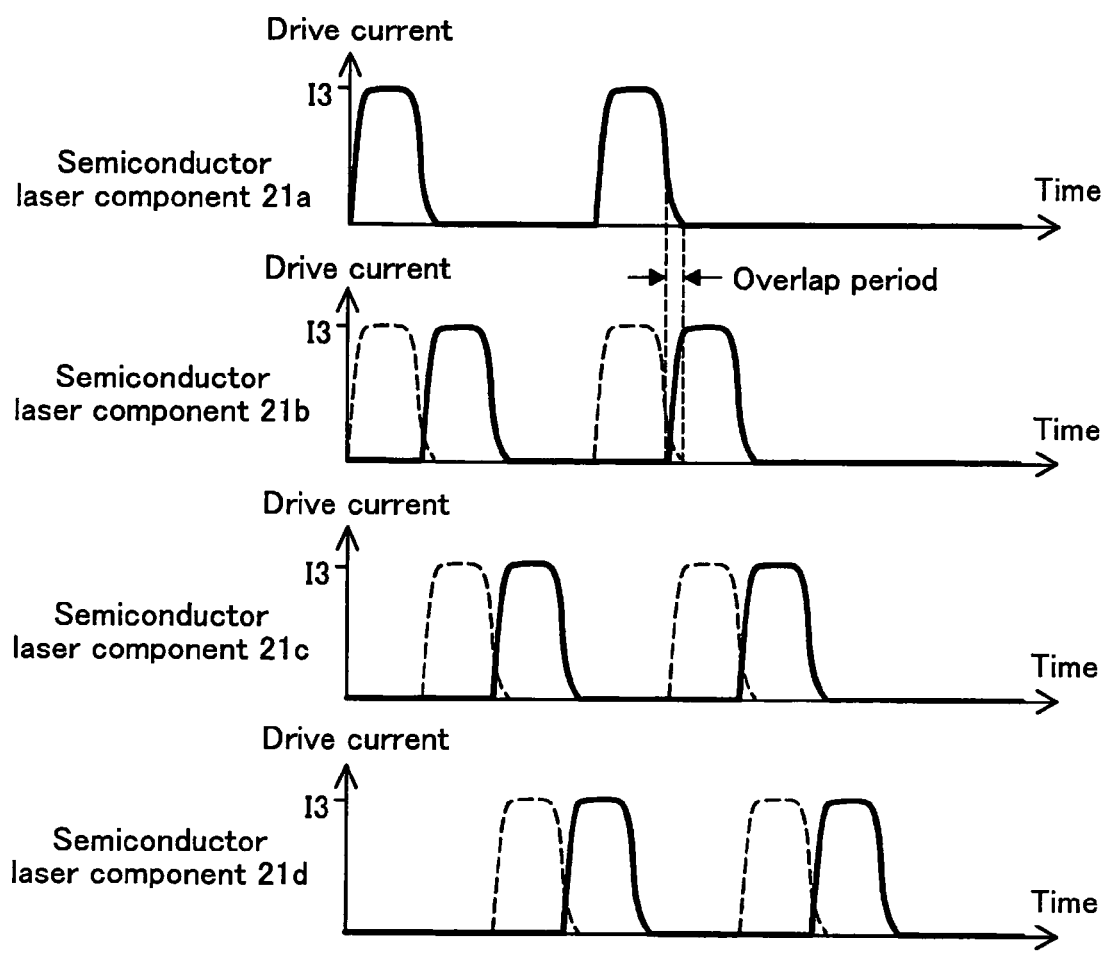
FIG. 12 is an explanatory drawing showing the changes over time of the drive current supplied to the semiconductor laser component with the seventh embodiment.

FIG. 12 is an explanatory drawing showing the changes over time of the drive current supplied to the semiconductor laser components 21a to 21d for a seventh embodiment. This embodiment is different from the second embodiment in that the pulses of the drive current supplied to the semiconductor laser components 21a to 21d mutually overlap in terms of time, and the remainder of the constitution is the same as the second embodiment.

See the second graph from the top in FIG. 12, as an exemplary drive current supplied to the semiconductor laser component 21b, where the pulse of the drive current supplied to the semiconductor laser component 21b overlaps in terms of time with the drive current pulse of the semiconductor laser component 21a shown by a broken line. The period at which the drive current pulse of the semiconductor laser component 21a is at its peak and the period at which the drive current pulse of the semiconductor laser component 21b is at its peak do not overlap with each other. Also, the constitution is such that at the period for which the two drive current pulses do overlap (hereafter called the "overlapping period"), the total value of the two drive currents is lower than the peak current value I3 or 100% current of one drive current pulse. Here, "peak current value" means the maximum current value when the output of the semiconductor laser components 21a to 21d is changed within an overall output power range. However, it is also possible to define the word such that the "peak current value" means the maximum current value that can be supplied to the semiconductor laser components 21a to 21d; the total value of the two drive current values is lower than the concerned maximum current value.

Note that with periods other than the overlapping period as well, the total value of the two drive currents is lower than the peak current value I3. Then, the same as with the drive current supplied to the semiconductor laser component 21b, the drive current supplied to the semiconductor laser component 21c overlaps in terms of time with the drive current supplied to the semiconductor laser component 21b, and the drive current supplied to the semiconductor laser component 21c overlaps in terms of time with the drive current supplied to the semiconductor laser component 21d. Also, the peak periods of the drive current supplied to the semiconductor laser components 21a to 21d do not overlap with each other.

Figure 13:
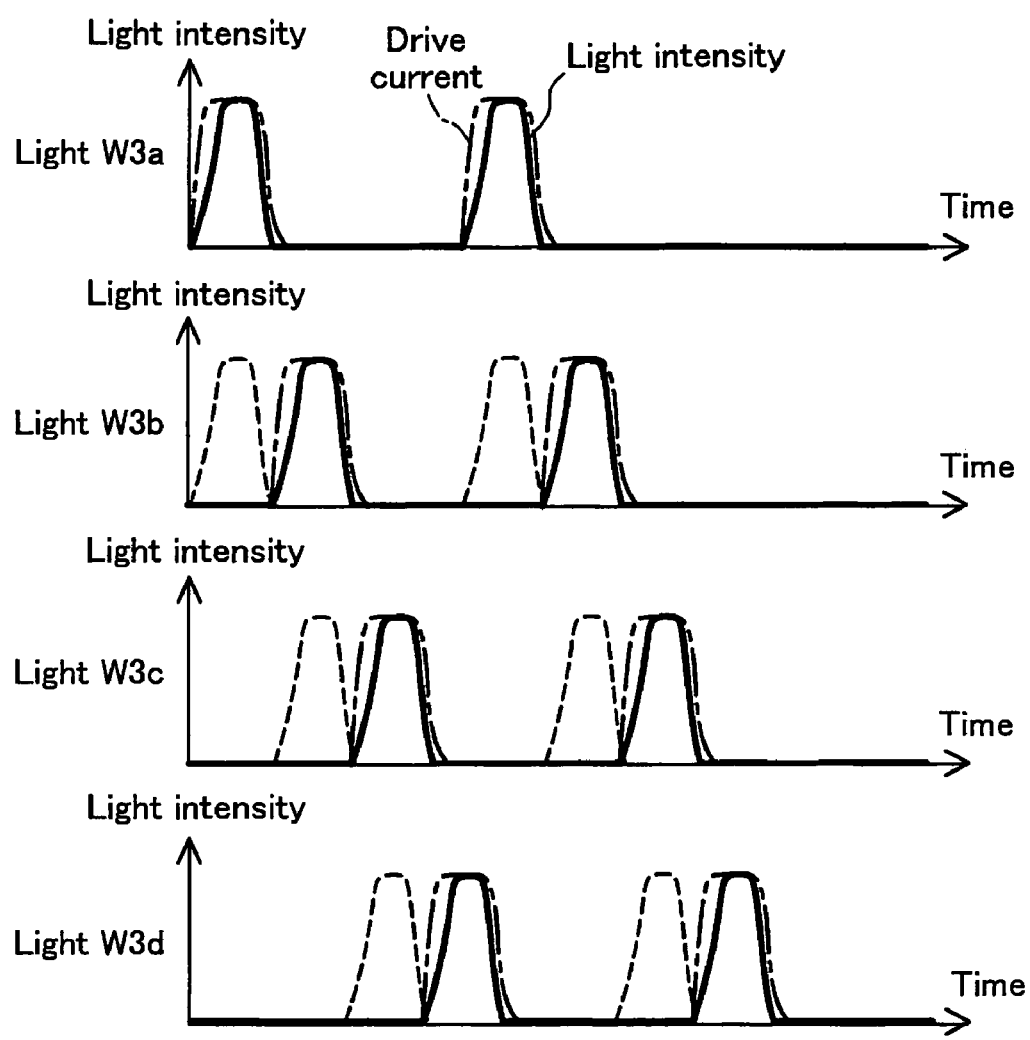
FIG. 13 is an explanatory drawing showing the change in light intensity of the lights emitted when the drive currents shown in FIG. 12 are supplied to the semiconductor laser components.

FIG. 13 is an explanatory drawing showing the changes in light intensity of the light W3a, W3b, W3c, and W3d emitted when the drive currents shown in FIG. 12 are supplied to the semiconductor laser components 21a to 21d. Note that the drive currents supplied to the semiconductor laser components 21a to 21d (FIG. 12) are noted using dotted lines. When the drive currents shown in FIG. 12 are supplied to the semiconductor laser components 21a to 21d, the timing for which the light intensity of the lights W3a to W3d emitted from the laser light source device 100 reach their peak do not overlap with each other as shown in FIG. 13. Therefore, it is possible to work with less required power and to make the power supply circuit scale smaller.

Note that the pattern of the drive currents supplied to the semiconductor laser components 21a to 21d is not limited to the pattern shown in FIG. 12 described above, and other patterns may also be assumed.

Figure 14:
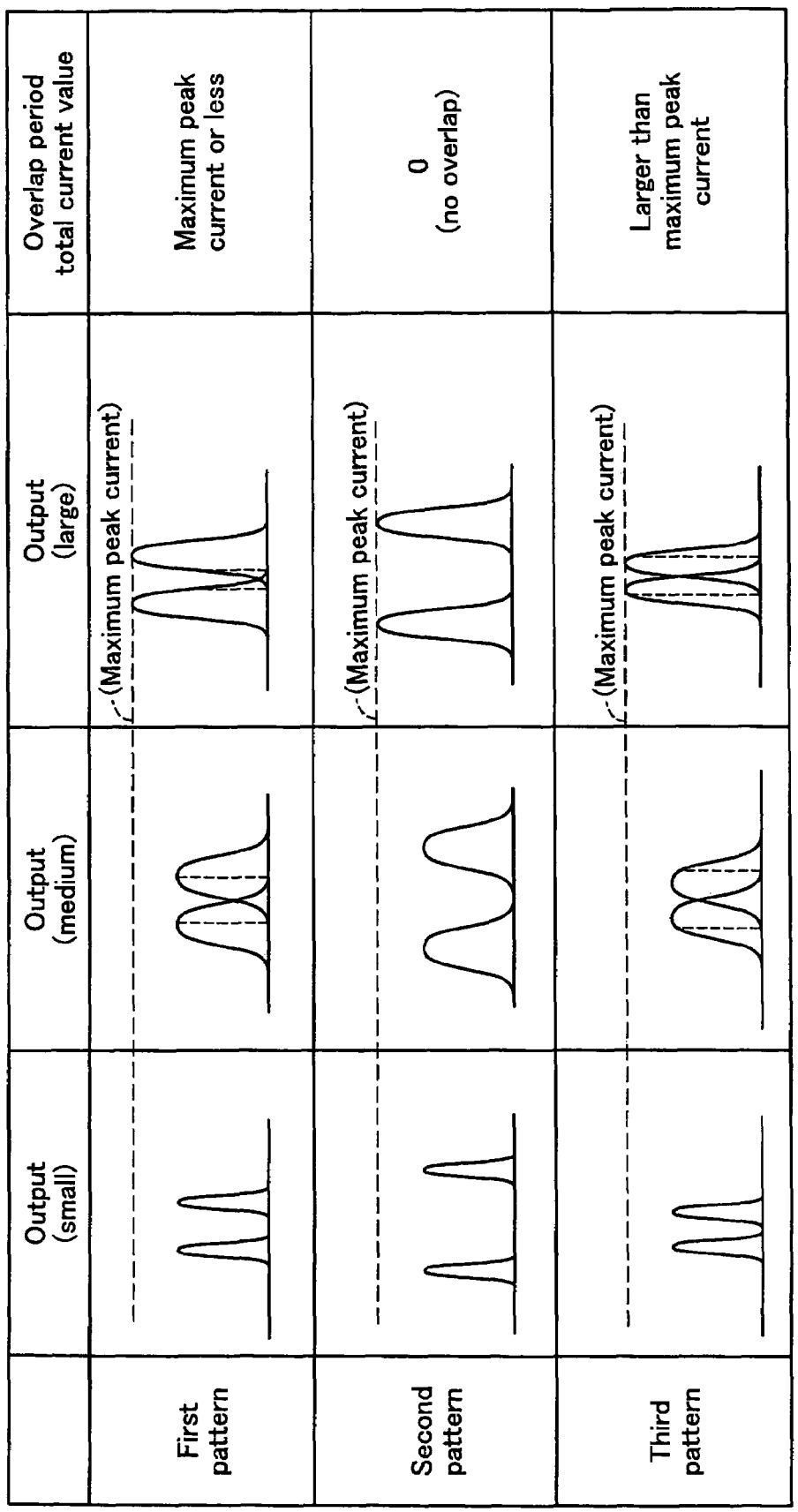
FIG. 14 is an explanatory drawing typically showing another pattern example of the drive current supplied to the semiconductor laser components.

FIG. 14 is an explanatory drawing typically showing exemplary patterns of the drive currents supplied to the semiconductor laser components. FIG. 14 shows three patterns which have different total current values at the overlap period. In the first pattern, the overlap time total current value is less than the maximum peak current value; in the second pattern the overlap period total current value is always 0 because there is no overlap; and in the third pattern the overlap period total current value is greater than the maximum peak current value. Each pattern includes three cases in which the output is large, medium, and small. The horizontal axis shows time, and the pulse is drawn in a typical shape. Two pulses supplied to mutually adjacent semiconductor laser components partially overlaps on the time axis. The change from the small output state to the medium output state maintains the peak current value as is while broadening the pulse width to increase the output. The change from the medium output state to the large output state makes the pulse width narrower while increasing the peak current value to increase the output; the duty ratio adjustment mode described before is used here. It can be seen that the overlap time period is shorter when the output is large than when the output is medium in the first and third patterns. With any of the patterns, the period for which two drive currents reach a peak do not overlap. Note that with the example in FIG. 14, the peak current value when the output is large is defined as the maximum peak current value.

For the first pattern, the same as with the pattern shown in FIG. 12, when the output is medium or large, the overlap period total current value is less than the maximum peak current value. Note that when the output is small, there is no overlapping period, so the total value of the drive current supplied to two adjacent semiconductor laser components is less than the maximum peak current value.

For the second pattern, regardless of the size of the output, an overlap period never occurs. With this pattern as well, the same as when the output is small with the first pattern, the total value of the drive current supplied to two adjacent semiconductor laser components is always less than the maximum peak current value.

For the third pattern, when the output is medium or large, the overlap period total current value is greater than the maximum peak current value. However, when the output is small, the pulses of the drive current supplied to two adjacent semiconductor laser components do not overlap in terms of time, and therefore the total value of the drive current supplied to these two semiconductor laser components is less than the maximum peak current value. With the third pattern, if the device is used most of the time with the small output state under a rated current value, and if the device is rarely used with the medium and large output states exceeding the rated current value for a short time, a component with high current drivability is not required, and it is possible to suppress a rise in manufacturing cost of the laser light source device. Note that in this case as well, when the rated current value is exceeded, it is preferable to keep this under the absolute maximum rated current value.

As can be understood from these patterns, it is preferable that the peak output periods for which the drive currents for plural semiconductor laser components reach a peak do not overlap, regardless of the length or shortness of the overlap period of the drive current pulses, and regardless of the output state, so it is possible to suppress the volume of power required overall for the laser light source device from becoming extremely high. Because of this, components with high current drivability are not required, and it is possible to suppress a rise in the manufacturing cost of the laser light source device. It is preferable that the total value of the drive currents supplied to plural semiconductor laser components be less than the maximum peak current value.

H. Eighth Embodiment

Figure 15:
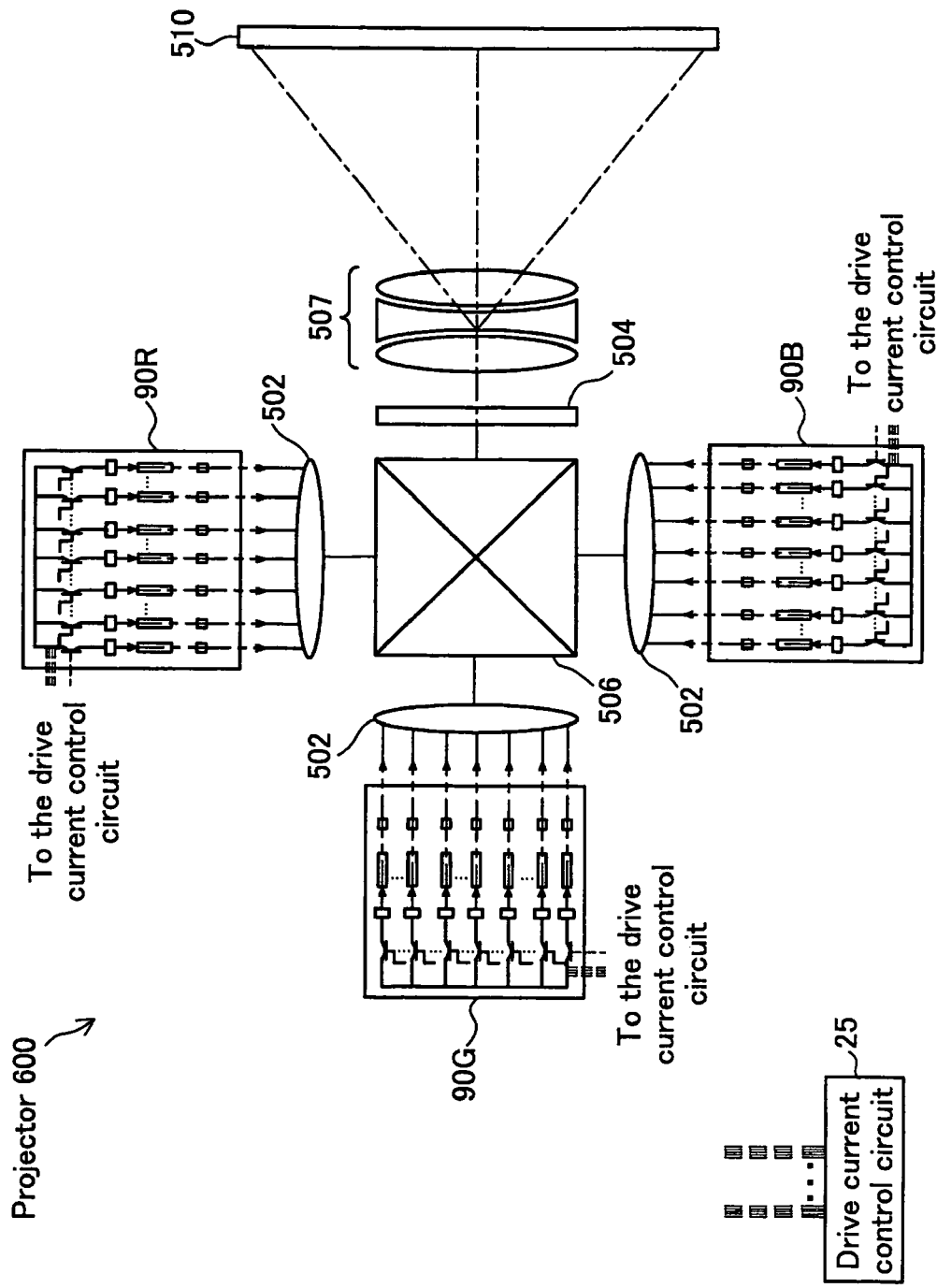
FIG. 15 is a schematic structural drawing of the projector to which is applied the laser light source device of this invention.

FIG. 15 is a schematic structural diagram of a projector using the laser light source device according to the present invention. The projector 600 of the eighth embodiment differs from the projector 500 (FIG. 11) of the sixth embodiment in the four points noted below, and the remainder of the constitution is the same as the sixth embodiment. Specifically, the first point is that there is installed only one liquid crystal light valve; the second point is the specific structure of the laser light source devices 90R, 90G, and 90B; the third point is that there is installed only one drive current circuit, but not for each laser light source device 90R, 90G, and 90B; and the fourth point is the aspect of changes over time of the drive current supplied to the laser light source devices 90R, 90G, and 90B.

The projector 600 is equipped with only one liquid crystal light valve 504 on the image side of the cross dichroic prism 506, and liquid crystal light valves are not arranged corresponding to each laser light source device 90R, 90G, and 90B. Note that the laser light source device 90R emits red light, the laser light source device 90G emits green light, and the laser light source device 90B emits blue light. With the liquid crystal light valve 504, an image for red, an image for green, and an image for blue are formed in sequence at fixed periods. Then, at the timing when the image for red is formed on the liquid crystal light valve 504, red light is emitted from the laser light source device 90R. Similarly, at the timing when the image for green is formed, green light is emitted from the laser light source device 90G, and at the timing when the blue image is formed, blue light is emitted from the laser light source device 90B. The switching between each color image is performed in a very short time, so for the user, it appears as if a full color image is being projected from the projector 600.

Figure 16:
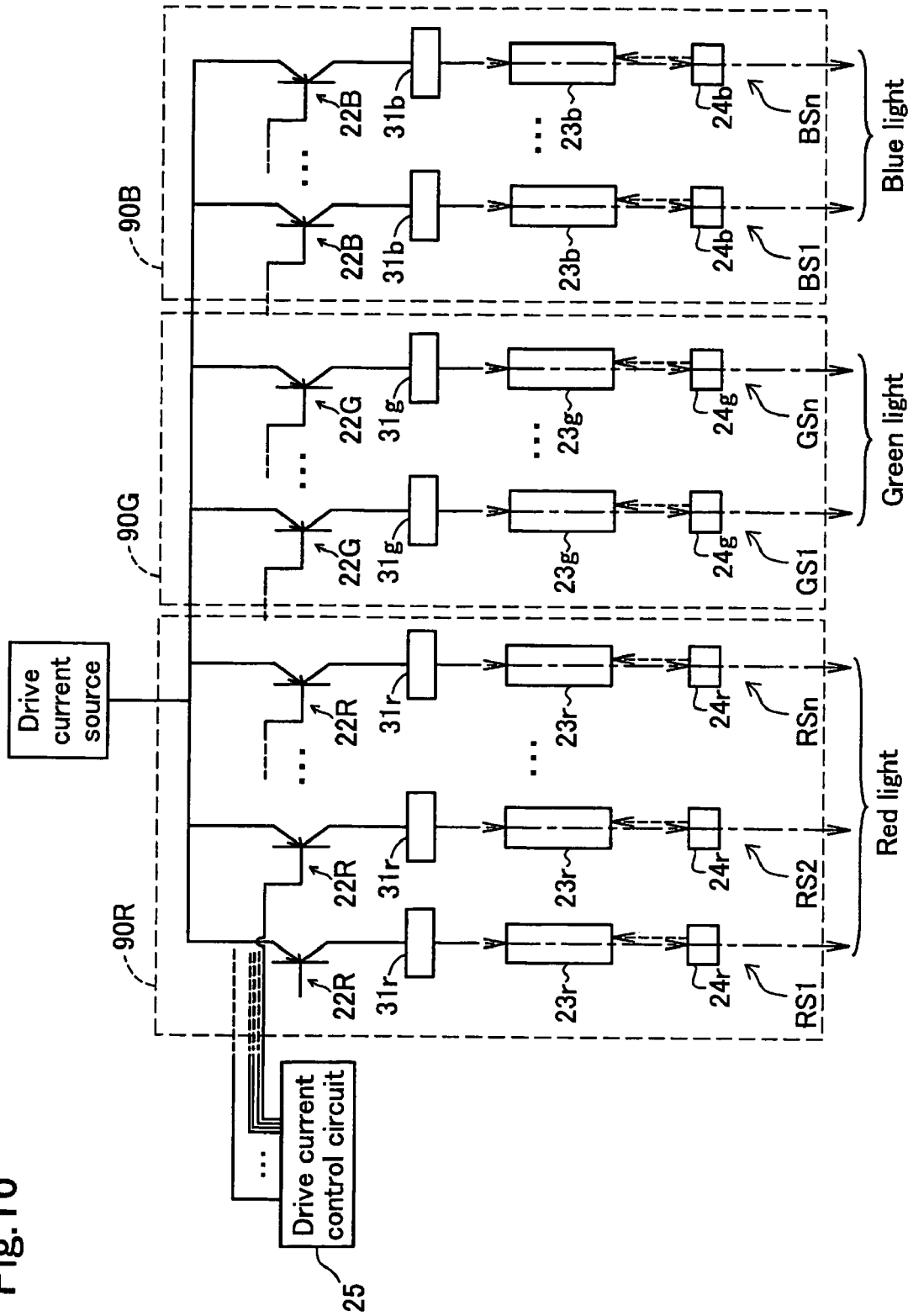
FIG. 16 is an explanatory drawing showing the detailed constitution of the three laser light source devices and the drive current control circuit 25 shown in FIG. 15.

FIG. 16 is an explanatory drawing showing the detailed constitution of the three laser light source devices 90R, 90G, and 90B and the drive current control circuit 25 shown in FIG. 15. Note that with FIG. 16, the three laser light source devices 90R, 90G, and 90B are drawn aligned for convenience.

The laser light source device 90R has a constitution for which the n number of laser light source units RS1 to RSn are connected to each other in parallel. Each laser light source unit RS1 to RSn includes the transistor 22R (FIG. 8), the semiconductor laser component 31r, the wavelength conversion component 23r, and the mirror 24r. The laser light source device 90G and the laser light source device 90B have the same constitution, the laser light source device 90G is equipped with the n number of laser light source units GS1 to GSn, and the laser light source device 90B is equipped with the n number of laser light source units BS1 to BSn. Note that the laser light source units RS1 to RSn emit light of roughly the same colors after the wavelength conversion. Similarly, the laser light source units GS1 to GSn emit light of roughly the same color after the wavelength conversion. Also, the laser light source units BS1 to BSn also emit light of roughly the same color after the wavelength conversion. For example, with the laser light source units RS1 to RSn, the emitted light is red light of any wavelength roughly within the wavelength range of 585 nm to 780 nm. Also, with the laser light source units GS1 to GSn, the emitted light is green light of any wavelength roughly within the wavelength range of 495 nm to 585 nm. Also, with the laser light source units BS1 to BSn, the emitted light is blue light of any wavelength roughly within the wavelength range of 380 to 495 nm. Here, each of the laser light source units RS1 to RSn, GS1 to GSn, and BS1 to BSn is connected to one drive current control device 25. The drive current control circuit 25 controls the drive current supplied to these 3n laser light source units RS1 to RSn, GS1 to GSn, and BS1 to BSn.

Figure 17:
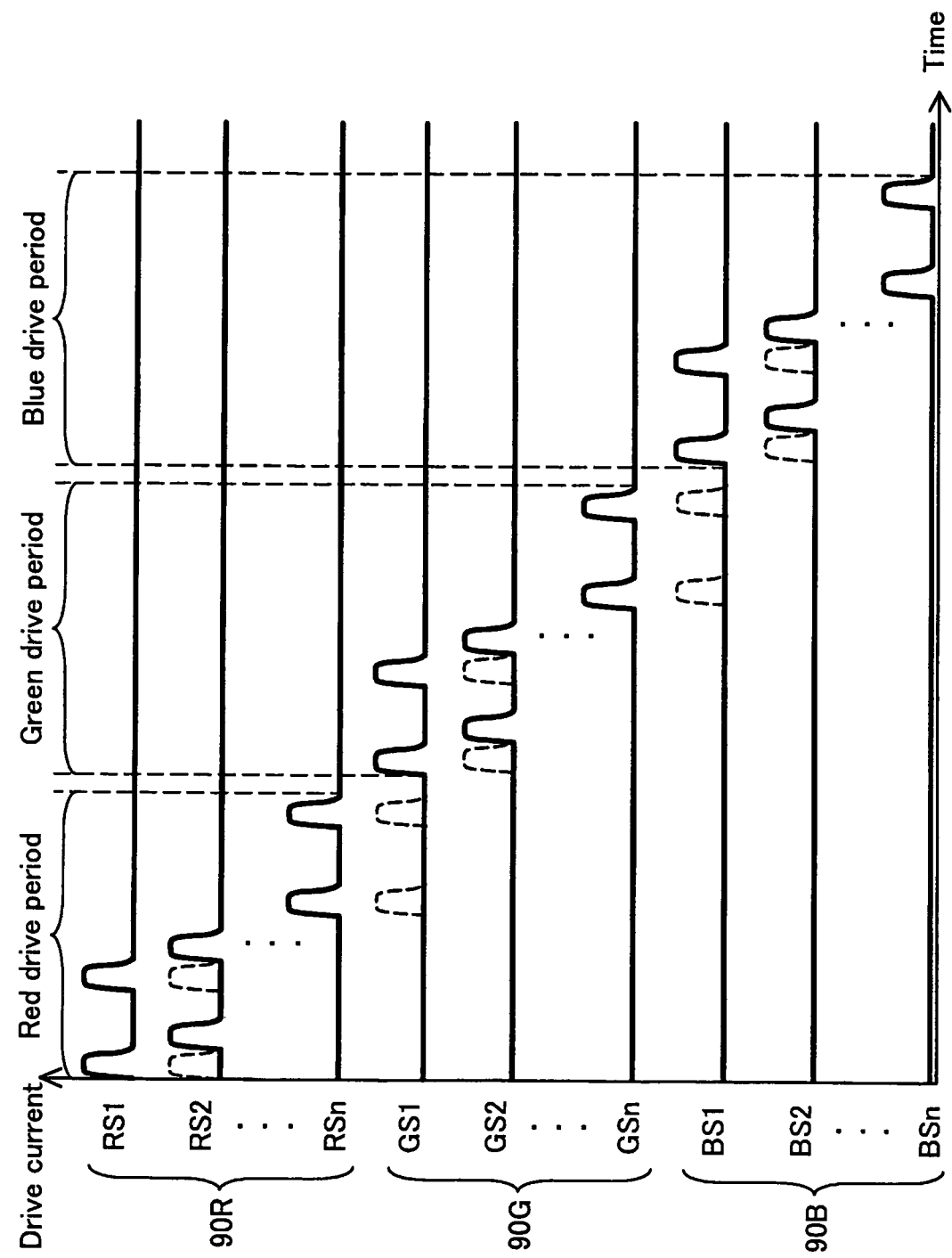
FIG. 17 is an explanatory drawing showing the drive current supplied to the laser light source units of FIG. 16.

FIG. 17 is an explanatory drawing showing the drive current supplied to the laser light source units RS1 to RSn, GS1 to GSn, and BS1 to BSn of FIG. 16. Drive current is supplied respectively to the three laser light source devices 90R, 90G, and 90B in this sequence. Then, within the laser light source devices 90R, 90G, and 90B, the drive current is supplied so that the peak current values of the laser light source units occur not simultaneously but in sequence. In specific terms, after the drive current supplied to the laser light source unit RS1 becomes the peak current value, the drive current supplied to that adjacent laser light source unit RS2 becomes the peak current value. Note that the detailed changes over time of the two drive currents at this time are the same as the changes over time of the two drive currents supplied to the adjacent semiconductor laser components with the seventh embodiment (FIG. 12). Specifically, the drive current peak period does not overlap between plural laser light source units, and the drive current total value during the drive current pulse overlap period is less than the peak current value.

After the red drive period in which the drive current is supplied to each of the laser light source unit RS1 through the final laser light source unit RSn, the green drive period starts. Then, when the green drive period ends, the blue drive period starts, and when the blue drive period ends, the red drive period is again returned to. Here, an interval is provided between each color drive period. In specific terms, for example after the red drive period ends, until the green drive period starts, there is a period for which drive current is not supplied to any of the laser light source units. Specifically, there is absolutely no overlapping of the pulse of the drive current supplied to the final laser light source unit RSn for the laser light source device 90R and the pulse of the drive current supplied to the first laser light source unit GS1 for the laser light source device 90G. Similarly, there is absolutely no overlapping of the pulse of the drive current supplied to the laser light source unit GSn and the pulse of the drive current supplied to the laser light source unit BS1.

By using this kind of constitution, it is possible to suppress the occurrence of color shifts (e.g. red becoming stronger at locations where red is weak in the original image) for images projected by the projector 600, thereby improving color reproducibility. Also, within the laser light source devices 90R, 90G, and 90B, the drive current is supplied so that each of the laser light source units reaches the peak current value in sequence, and the same effect as that of the projector 500 of the sixth embodiment is effected.

I. VARIATION EXAMPLES

Note that among the constitutional elements of the embodiments noted above, elements other than the elements claimed with the independent claims are additional elements, and can be omitted as appropriate. Also, this invention is not limited to the embodiments and aspects noted above, and it is possible to implement this in various aspects in a range that does not stray from the key points, for example the following variations are possible.

I1. Variation Example 1

With the embodiments described above, the semiconductor laser components 21a to 21d, 31r, 31g, and 31b which are equipped in the laser light source devices 100, 100a, 90R, 90G, and 90B are made to be surface emitting type laser components, but instead of surface emitting type laser components, it is also possible to use edge-emitting type laser elements for which the light resonance direction is parallel in relation to the substrate surface. Also, the light source does not have to include a semiconductor laser component that utilizes internal resonance, and may include a laser device that does not utilize internal resonance, such as solid state laser, gas laser or the like. For example, when the light source is constituted by a YAG (Yttrium Aluminum Garnet) laser device, the light obtained by irradiating the light from the excitation light source (e.g. a semiconductor laser) on a YAG crystal laser rod is resonated by an external resonator and amplified to be emitted. It is also possible to not perform external resonance at the laser light source devices 100, 100a, 90R, 90G, and 90B. Specifically, it is also possible to use a constitution in which the fundamental laser light emitted from the semiconductor laser components undergoes wavelength conversion at the wavelength converter, and the wavelength converted light is used for irradiation, and in which the light which has not undergone wavelength conversion is not used for external resonance. Even with the kind of constitution noted above, pulse form drive current is supplied to each light source, and by adjusting the drive current pulse width (or duty ratio) and the peak current value, it is possible to increase the emitted light intensity while suppressing an increase in the supplied power.

I2. Variation Example 2

With the embodiments described above, the plurality of semiconductor laser components. 21a to 21d, 31r, 31g, and 31b formed a one dimensional array structure, but it is also possible to have a constitution that forms a two dimensional array structure. Also, the laser light source devices 100 and 100a are constituted to be equipped with a plurality of semiconductor laser components 21a to 21d, 31r, 31g, and 31b, but it is also possible to constitute them to be equipped with only one semiconductor laser component. With this kind of constitution as well, it is possible to adjust the strength of the fundamental laser light emitted from at least one semiconductor laser component that the laser light source device 100 or 100a is equipped with according to the drive current peak current value. Also, by adjusting the drive current pulse width (or duty ratio), it is possible to suppress an increase in the volume of power supplied to the laser light source devices 100 and 100a.

I3. Variation Example 3

With the embodiments described above, when increasing the light intensity emitted from the laser light source devices 100, 100a, 90R, 90G, and 90B, the drive current pulse width (or duty ratio) and the peak current value are controlled so that the volume of power supplied to the laser light source devices 100, 100a, 90R, 90G, and 90B matches the volume of power supplied in the normal state, but the invention is not limited to this. For example, with the first embodiment, when shining more brightly than the normal state, with the example in FIG. 4A, the peak current value is made twice the normal state, and the duty ratio was 0.5, but instead of this, for example, it is also possible to have the peak current value be twice the normal state, and to have the duty ratio be 0.6. In this case, the supplied power volume is increased compared to the normal state. Also, for example, it is possible to have the peak current value be twice the normal state and to have the duty ratio be 0.25. In this case, the supplied power volume is reduced compared to the normal state. As can be understood from these examples, the supplied power volume may be increased or decreased compared to the normal state in order to increase the light intensity; in these cases as well it is possible to suppress an increase in the supplied power volume through adjustment of the peak current value and pulse width (or duty ratio), compared to the constitution which simply increases the drive current peak current value to increase the light intensity.

I4. Variation Example 4

With the embodiments described above, the drive current is controlled to increase the light intensity emitted from the laser light source devices 100, 100a, 90R, 90G, and 90B to make them shine more brightly, but it is possible to control the drive current in the similar way when reducing the emitted light intensity and making it shine more darkly. In specific terms, in the duty ratio adjustment mode, when returning from a brighter state to the normal state, it is possible to decrease the peak current value while increasing the duty ratio (or pulse width). Also, in the peak current value adjustment mode, to make it darker, it is possible to leave the duty ratio constant and to decrease the peak current value. With a constitution in which the drive current may be controlled in the duty ratio adjustment mode or in the peak current value adjustment mode, for example, it is also possible to control the drive current as described below to make it shine even more darkly. Specifically, if the duty ratio of the drive current is smaller than 0.25 when there is an instruction to make the device darker, the duty ratio is reduced until it reaches 0.25 while the peak current value is decreased in the duty ratio adjustment mode. Then, after the duty ratio reaches 0.25, the mode switches to the peak current value control mode, and only the peak current value is decreased with the duty ratio left fixed at 0.25. By controlling the drive current in this way, it is possible to have the pulses of the drive current supplied to the semiconductor laser components 21a to 21d, 31r, 31g, and 31b never overlap with each other in terms of time.

I5. Variation Example 5

With the third embodiment described above, the peak current value adjustment mode is used when the instructed brightness is lower (darker) than the designated threshold value, and the duty ratio adjustment mode is used when it is higher (brighter) than the designated threshold value, but conversely, it is also possible to use the duty ratio adjustment mode when the instructed brightness is lower than the designated threshold value, and to use the peak current value adjustment mode when it is higher than the designated threshold value. Also, the drive current control mode is selected according to whether or not the instructed brightness is higher than the designated threshold value, but it is also possible to have it determined by any other factor. For example, it is also possible to use the peak current value adjustment mode when the time elapsed after turning the power on is shorter than a threshold value, and to use the duty ratio adjustment mode when the elapsed time is longer than the threshold value. Also, for example, it is possible for the user to explicitly select one of the control modes to determine the control mode based on this selection (selection information).

I6. Variation Example 6

With the embodiments described above, in the normal state, a fixed drive current is always supplied to the semiconductor laser components 21a to 21d, 31r, 31g, and 31b, but it is also possible to supply pulse form drive current in the normal state as well.

I7. Variation Example 7

With the sixth and eighth embodiments described above, liquid crystal light valves are used as the light modulation units for the projectors 500 and 600, but other light modulation units may be used instead such as DMD (Digital Micromirror Device: Trademark of Texas Instruments Co. of the U.S.). Also, for the laser light source devices 100 and 100a of the first to third embodiments described above, in addition to monitoring devices (fifth embodiment) and projectors (sixth and eighth embodiments), it is possible to embody the present invention as any device requiring a light source such as an illumination device.

I8. Variation Example 8

With the seventh and eighth embodiments described above, the peak periods of the drive current pulses supplied to all the semiconductor laser components do not overlap with each other, but instead of this, it is also possible to have a constitution such that the peak periods do overlap with each other between some laser components. In this case as well, it is possible to work with less required power volume than when the peak periods overlap for all the laser components, and it is possible to make components with high current drivability unnecessary. As can be understood from both the embodiments and variation examples above, with the laser light source device according to the present invention, it is possible to use any constitution for which the timing does not overlap for the peaks of the drive current pulses supplied to at least two laser components, which correlate to the first and second fundamental light source components of the claimed invention.

I9. Variation Example 9

With the seventh embodiment described above, none of the peak periods of the drive current pulses supplied to the semiconductor laser components do not overlap, and none of the peaks of the light intensity of each light after wavelength conversion also do not overlap with each other, but instead of this, it is also possible to have a constitution such that some of the peak periods of the drive current pulses supplied to the semiconductor laser components overlap while none of the peak periods of the light intensity of each light after wavelength conversion do not overlap with each other. With this kind of case as well, since none of the peaks of the light intensity of each light after wavelength conversion do not overlap with each other, it is possible to work with less required power volume, and it is possible to make the power supply circuit scale smaller. As can be understood from the embodiments and variation examples above, with the laser light source device according the present invention, it is possible to use any constitution having at least two laser components, correlating to the first and second fundamental light source components in the claimed invention, for which the timings at which the light intensity after wavelength conversion becomes the peak do not mutually overlap.

I10. Variation Example 10

With the third embodiment described above, the duty ratio adjustment mode and the peak current value adjustment mode are set in advance as the available drive current control modes, but it is also possible to set other control modes in advance. In specific terms, for example, with the seventh embodiment, as with the case of the change from small to medium output states as shown in FIG. 14, it is possible to use a control mode that broadens the pulse width of the drive current pulse while maintaining the peak current value as is. By working in this way, it is possible to select a desirable control mode according to the application. As can be understood from the embodiments and variation examples above, with the laser light source device according to the present invention, it is possible to use a plurality of control modes with mutually different drive current pulse widths.

What is claimed is:

1. A laser light source device, comprising:
   a light source section including:
      a first fundamental light source component configured to emit first fundamental wave light according to supplied drive current;
      a second fundamental light source component configured to emit second fundamental wave light according to supplied drive current; and
      a wavelength conversion component configured to perform wavelength conversion of the first and second fundamental wave lights to produce first and second converted lights;
      a drive current controller configured to control the drive current supplied to the first fundamental light source component and the second fundamental light source component; and
      wherein the first and second fundamental light source components emit the fundamental wave lights such that the first and second converted lights have substantially same color, and the first and second converted lights have no mutually overlapping timing at which light intensities of the converted lights reach their peak.

2. The laser light source device in accordance with claim 1, wherein
   the drive current controller controls the drive currents supplied to the first fundamental light source component and the second fundamental light source component such that peak timings of the drive currents supplied to the first and second fundamental light source components do not overlap.

3. The laser light source device in accordance with claim 2, wherein
   the drive current controller controls at any timing a total value of the drive currents supplied to the first and second fundamental light source components so as to be kept under a peak current value of one fundamental light source component.

4. The laser light source device in accordance with claim 2, comprising:
   a plurality of light source sections including a first light source section and a second light source section,
   wherein the first light section and the second light section emit light of mutually different colors as the converted lights, and
   the drive current controller controls at any timing the drive current supplied to each light source component such that the drive currents do not overlap in terms of time between the light source sections.

5. A laser light source device, comprising:
   a light source section including:
      a fundamental light source component configured to emit fundamental wave light according to a supplied drive current; and
      a wavelength conversion component configured to perform wavelength conversion of the fundamental wave light to produce converted light; and
      a drive current controller configured to control the drive current supplied to the fundamental light source component,
      wherein the drive current controller has a plurality of control modes in which pulse widths of the drive current are mutually different,
      wherein the plurality of control modes includes a first control mode that narrows the pulse width while increasing a peak current, and
      wherein the drive current controller controls the drive current with the first control mode so as to increase light intensity of the converted light.

6. The laser light source device in accordance with claim 5, wherein
   the plurality of control modes further includes a second control mode that increases the peak current while keeping the pulse width fixed, and
   the drive current controller controls the drive current with the second control mode so as to increase the light intensity of the converted light.

7. The laser light source device in accordance with claim 6, wherein
   the drive current controller controls the drive current with the first control mode when the light intensity of the converted light is in a relatively high first light intensity range, and controls the drive current with the second control mode when the light intensity of the converted light is in a relatively low second light intensity range.

8. The laser light source device in accordance with claim 5, comprising:
   a plurality of light source sections for emitting mutually different color lights,
   wherein, for each of the colors, the drive current controller controls the pulse width and the peak current of the drive current supplied to the light source section that emits that color light.

9. A monitoring device comprising:
the laser light source device in accordance with claim 1; and
an image capturing unit configured to take an image of an object irradiated by the laser light source device.

10. An image display device, comprising:
the laser light source device in accordance with claim 1;
a light modulation unit configured to modulate the light emitted from the laser light source device according to an image signal; and
a projection optical system configured to project the modulated light to display an image.

11. A method for use in a laser light source device including a fundamental light source component for emitting fundamental wave light according to a supplied drive current, and a wavelength conversion component for performing wavelength conversion of the fundamental wave light to produce converted light, the method comprising the step of:

(a) narrowing a pulse width of the drive current while increasing a peak current of the drive current to increase light intensity of the converted light.

* * * * *